(12) United States Patent
Lee

(10) Patent No.: US 9,369,046 B2
(45) Date of Patent: Jun. 14, 2016

(54) POWER CONVERTERS WITH ADAPTIVE SLEW RATE AND METHODS OF OPERATING SAME

(71) Applicant: Samsung Electronics Co., Ltd., Suwon-si (KR)

(72) Inventor: KyoungJin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 146 days.

(21) Appl. No.: 14/087,246

(22) Filed: Nov. 22, 2013

(65) Prior Publication Data
US 2014/0159687 A1    Jun. 12, 2014

(30) Foreign Application Priority Data

Dec. 7, 2012  (KR) .......................... 10-2012-0142129

(51) Int. Cl.
*H02M 3/158*  (2006.01)
*H03K 17/16*  (2006.01)

(52) U.S. Cl.
CPC ........... *H02M 3/1588* (2013.01); *H03K 17/166* (2013.01); *H03K 17/167* (2013.01); *Y02B 70/1466* (2013.01)

(58) Field of Classification Search
CPC .......... H02M 1/44; H02M 2001/0025; H02M 3/157; H02M 3/1588; H02M 2001/0029
See application file for complete search history.

(56) References Cited

U.S. PATENT DOCUMENTS

| 5,952,817 | A | 9/1999 | Brester et al. |
| 6,040,686 | A | 3/2000 | Schenkel |
| 6,153,948 | A * | 11/2000 | Cogan et al. .................. 307/117 |
| 6,476,683 | B1 | 11/2002 | Saito et al. |
| 6,871,289 | B2 | 3/2005 | Pullen et al. |
| 7,872,546 | B1 | 1/2011 | Mohtashemi et al. |
| 8,305,053 | B2 * | 11/2012 | Truong et al. ................. 323/224 |
| 8,638,131 | B2 * | 1/2014 | Chen .................... H03K 17/163 327/108 |
| 2010/0194371 | A1 | 8/2010 | Satou et al. |
| 2012/0013315 | A1 | 1/2012 | Popescu et al. |
| 2012/0062190 | A1 | 3/2012 | Haiplik et al. |

FOREIGN PATENT DOCUMENTS

| JP | 2004-112958 | 4/2004 |
| JP | 2009-111470 | 5/2009 |

* cited by examiner

*Primary Examiner* — Harry Behm
*Assistant Examiner* — Peter Novak
(74) *Attorney, Agent, or Firm* — Myers Bigel & Sibley, P.A.

(57) ABSTRACT

A power converter includes a converter circuit comprising a semiconductor switch configured to couple a power supply node to an output node responsive to an input signal applied to a control terminal thereof. The power converter further includes a slew rate limiter circuit coupled to the control terminal of the semiconductor switch and configured to limit a slew rate of an output voltage at the output node. The semiconductor switch may include a field-effect transistor (FET), the control terminal may include a gate terminal of the FET, and the slew rate limiter circuit may include a capacitor having a capacitance less than a gate-source capacitance of the FET.

16 Claims, 25 Drawing Sheets

POWER CONVERTERS WITH ADAPTIVE SLEW RATE AND METHODS OF OPERATING SAME

CROSS-REFERENCE TO RELATED APPLICATIONS

A claim for priority under 35 U.S.C. §119 is made to Korean Patent Application No. 10-2012-0142129 filed Dec. 7, 2012, in the Korean Intellectual Property Office, the entire contents of which are hereby incorporated by reference.

BACKGROUND

Embodiments of the present inventive subject matter relate to power conversion circuits, and more particularly, to DC-DC converter circuits.

A conventional switching buck converter may perform a power switching operation using a power switch to generate a predetermined DC voltage. A rapid variation in a current flow generated by a power switching on/off operation may cause a voltage spike of a switching output node. The voltage spike may be due to internal wire bond inductance and printed circuit board (PCB) parasitic inductance.

One technique for reducing or eliminating voltage spikes is to reduce the slew rate of the power switch. However, reducing the slew rate may increase switch conduction power loss increases and reduce efficiency.

SUMMARY

Some embodiments of the inventive subject matter provide a power converter including a converter circuit comprising a semiconductor switch configured to couple a power supply node to an output node responsive to an input signal applied to a control terminal thereof. The power converter further includes a slew rate limiter circuit coupled to the control terminal of the semiconductor switch and configured to limit a slew rate of an output voltage at the output node. The semiconductor switch may include a field-effect transistor (FET), the control terminal may include a gate terminal of the FET, and the slew rate limiter circuit may include a capacitor having a capacitance less than a gate-source capacitance of the FET.

The power converter may further include a slew rate controller circuit coupled to the slew rate limiter circuit and configured to adaptively control a current flowing through the slew limiter circuit responsive to a load variation at the output node. The slew rate controller circuit may include a resistance that varies responsive to a slew rate control signal.

The power converter may also include an adaptive switch controller circuit configured to monitor the output voltage and to generate the slew rate control signal responsive to the monitored output voltage. The adaptive switch controller circuit may include a sample and hold circuit configured to sample the output voltage, a comparator circuit configured to compare first and second voltage samples produced by the sample and hold circuit and to generate a comparison signal responsive to the comparison and an integrator circuit configured to integrate the comparison signal to generate the slew rate control signal. The power converter may further include a diode in a discharge path of the integrator.

The sample and hold circuit may be configured to generate a value corresponding to a sum of the sampled output voltage of the switching output node and a threshold voltage representing an allowable voltage spike.

Further embodiments provide methods of operating a power converter comprising a semiconductor switch configured to couple a power supply node to an output node responsive to an input signal applied to a control terminal thereof. The methods include monitoring an output voltage of the output node and varying an impedance at the control terminal responsive to the monitored output voltage to vary a slew rate of the output voltage. Varying an impedance at the control terminal responsive to the monitored output voltage may include varying a resistance coupling a capacitor to the control terminal.

Further embodiments provide a power converter including a semiconductor switch configured to couple a power supply node to an output node responsive to an input signal applied to a control terminal thereof, a capacitor, a variable resistor coupling the capacitor to the control terminal of the semiconductor switch and a slew rate control circuit configured to control the variable resistor responsive to an output voltage at the output node. The semiconductor switch may include an FET and the control terminal may include a gate terminal of the FET.

The slew rate control circuit may include a sampling circuit configured to generate samples of the output voltage and a control signal generation circuit configured to apply a control signal to the variable resistor responsive to the samples. The sampling circuit may include a sample and hold circuit that the control signal generation circuit may include a comparator circuit configured to compare and output of the sample and hold circuit to the output voltage to generate a comparison signal and an integrator configured to integrate the comparison signal to generate the control signal. The sample and hold circuit may be configured to sample the output voltage at a frequency of the input signal.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
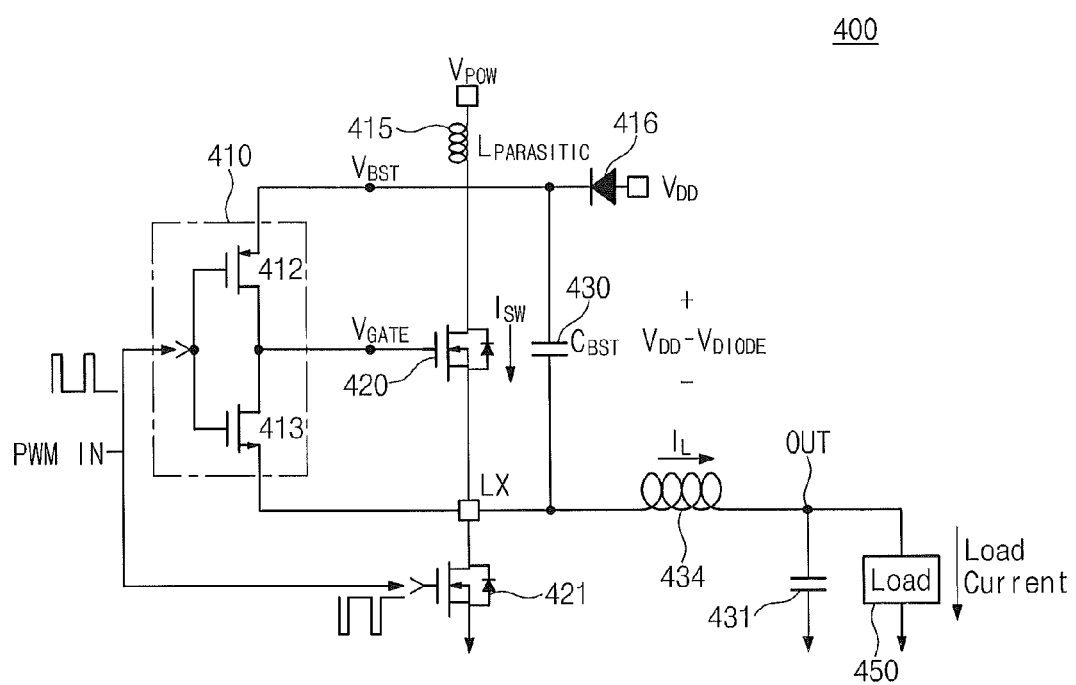
FIG. 1 is a circuit diagram illustrating a conventional buck converter.

Embodiments will be described in detail with reference to the accompanying drawings. The inventive subject matter, however, may be embodied in various different forms, and should not be construed as being limited only to the illustrated embodiments. Rather, these embodiments are provided as examples so that this disclosure will be thorough and complete, and will fully convey the subject matter of the inventive subject matter to those skilled in the art. Accordingly, known processes, elements, and techniques are not described with respect to some of the embodiments of the inventive subject matter. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive subject matter.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed therein may include their complementary embodiments.

Figure 2:
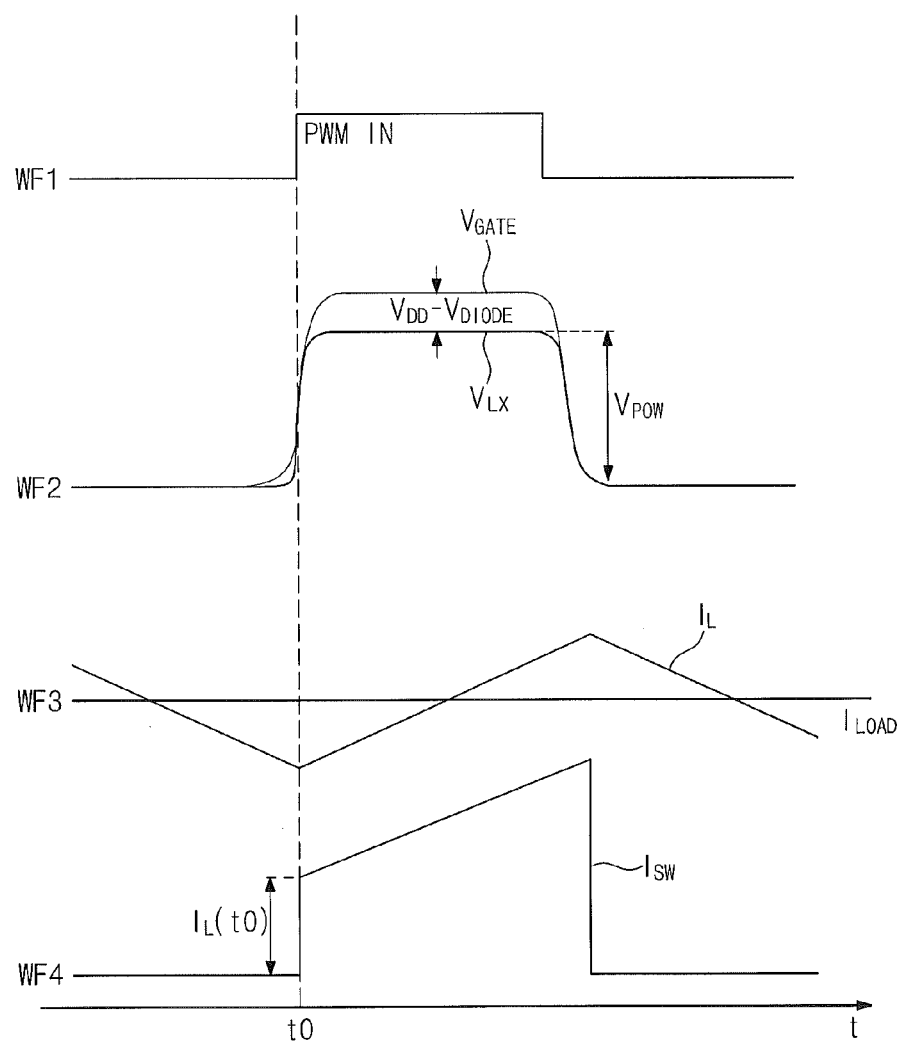
FIG. 2 is a waveform diagram illustrating operations of the converter of FIG. 1.

FIG. 1 is a circuit diagram schematically illustrating a conventional buck converter. FIG. 2 is a signal waveform diagram illustrating nodes of a converter circuit of FIG. 1.

Referring to FIG. 1, there is illustrated a circuit block of a conventional high side n-channel switching buck converter.

The converter circuit may include a p-channel power switch 420 and an re-channel switch 421 connected in series between a driving power node VPOW and a ground $V_{SS}$.

The converter circuit may include a gate driver 410 formed of a p-channel transistor 412 and an n-channel transistor 412. The gate driver 410 may generate a gate voltage $V_{GATE}$ at its output terminal in response to an input (e.g., a PWM signal, etc.). The gate voltage $V_{GATE}$ of the gate driver 410 may be applied to a gate of the n-channel power switch 420.

A capacitor 430 for boosting of the gate voltage may be connected between a cathode of a diode 416 and a switching output node LX of the n-channel power switch 420, and a power supply voltage $V_{DD}$ may be connected to an anode of the diode 416. The switching output node LX may be connected to an inductor 434 and a capacitor 431. An inductor 415 may be a parasitic inductor.

In operation, when a gate voltage of the n-channel power switch 420 is higher by a threshold voltage than a drain-source voltage thereof, the n-channel power switch 420 may be switched on. In the event that the high side n-channel power switch 420 is switched on, the gate voltage $V_{GATE}$ of the n-channel power switch 420 is higher than a voltage of the driving power node VPOW. Therefore, the gate voltage $V_{GATE}$ of the n-channel power switch 420 may be boosted to voltage greater than a voltage of the driving power node VPOW according to a bootstrap operation like a waveform WF2 of FIG. 2.

In FIG. 2, a horizontal axis indicates time, and a vertical axis indicates a voltage or current level.

A signal waveform WF1 indicates an input applied to a circuit of FIG. 1, that is, a waveform of a PWM signal. A signal waveform WF2 indicates an output voltage $V_{LX}$ of a switching output node LX of the n-channel power switch 420 and the gate voltage $V_{GATE}$ of the n-channel power switch 420. A signal waveform WF3 indicates a current IL of the inductor 434 of the switching output node LX and a load current $I_{LOAD}$, and a signal waveform WF4 indicates a switching current generated by a switching operation of the re-channel power switch 420.

In the event that the high side n-channel power switch 420 is switched off, a voltage of the switching output node LX may be set to a ground under an ideal condition, and a voltage CBST of the capacitor 430 may be charged up to a voltage corresponding to a power supply voltage minus a voltage of the diode 416 (i.e., $V_{DD}-V_{DIODE}$).

At t0, if an input PWM signal has a high pulse, the gate voltage VGATE is increased by the gate driver 410. If the n-channel power switch 420 is turned on by the gate voltage $V_{GATE}$, a voltage $V_{LX}$ of the switching output node LX starts to increase as illustrated by the signal waveform WF2 of FIG. 2.

A drain voltage VBST of the n-channel transistor 412 of the gate driver 410 may go to a voltage level of $V_{LX}+(V_{DD}-V_{DIODE})$ on the basis of a ground (e.g., 0V). The voltage $V_{DD}-V_{DIODE}$ may be a pre-charge voltage $C_{BST}$ of the capacitor 430. The drain voltage VBST may increase along with an increase in the voltage $V_{LX}$ of the switching output node LX. The voltage $V_{LX}$ of the switching output node LX increases to a voltage of the driving power node VPOW under an ideal condition. In this case, the gate driver 410 may receive the drain voltage $V_{BST}$ as an operating voltage to generate the gate voltage $V_{GATE}$ bootstrapped. Referring to a signal waveform WF2 of FIG. 2, the gate voltage $V_{GATE}$ may be bootstrapped to a voltage level of $V_{LX}$ ($V_{DD}-V_{DIODE}+V_{POW}$).

Referring to a signal waveform WF4 of FIG. 2, a switching current ISW generated by a switching operation of the n-channel power switch 420 sharply increases at time t0. A current sharply varied from a switching on time may cause occurrence of a voltage spike due to parasitic inductance $L_{PARASITIC}$ of a parasitic inductor 415 derived from a PCB layout design or wire bonding of a circuit as illustrated in FIG. 3.

Figure 3A:
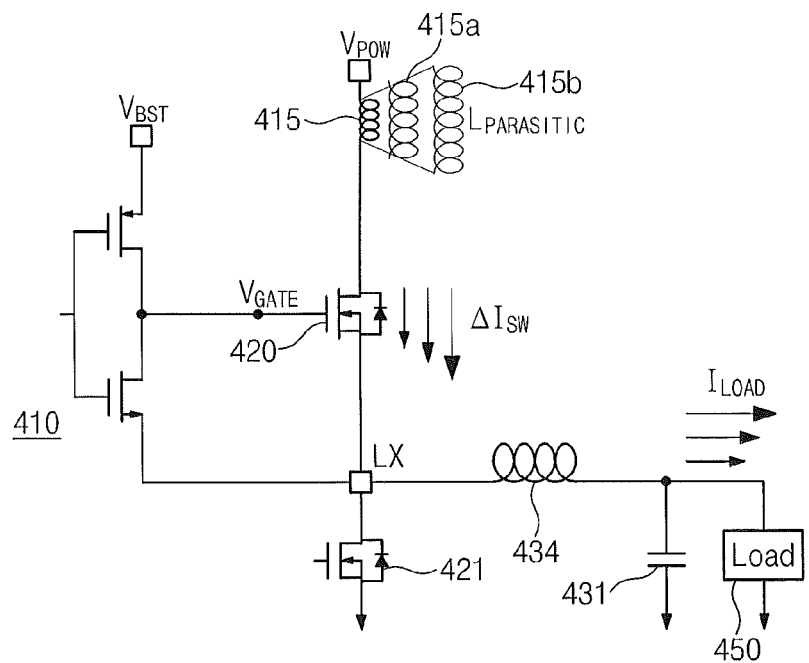
FIGS. 3A and 3B are a circuit diagram and a waveform diagram, respectively, illustrating generation of a voltage spike in the converter of FIG. 1.
Figure 3B:
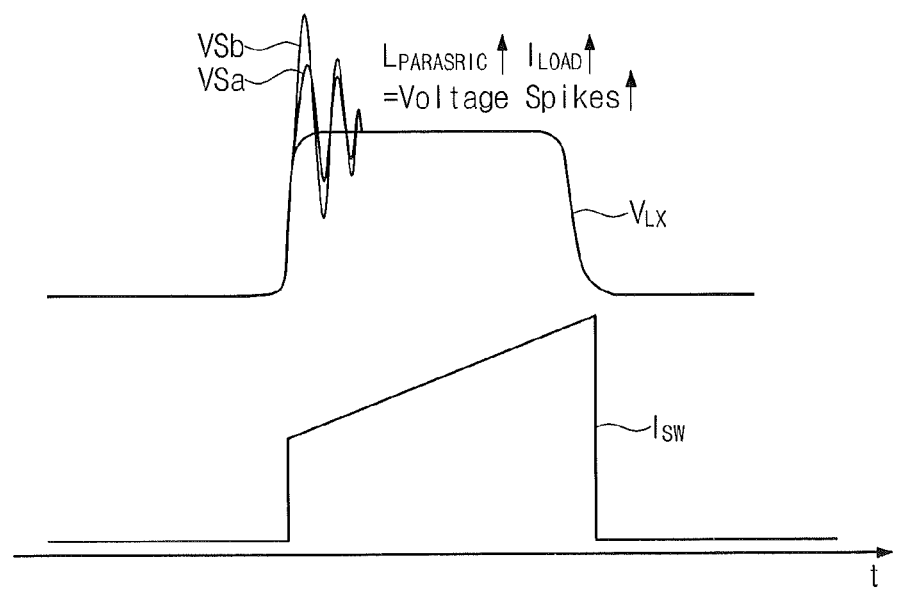

FIGS. 3A and 3B illustrate generation of voltage spikes due to parasitic inductance in the converter circuit of FIG. 1.

FIGS. 3A and 3B illustrate examples in which parasitic inductors 415, 415a, and 415b having different values of inductance are disposed at a drain of an n-channel power switch 420. As a level of a load current $I_{LOAD}$ is increased (or, a switching slew rate $\Delta_{ISW}$ becomes faster), a level of a voltage spike may become higher.

Referring to an output voltage $V_{LX}$ of FIGS. 3A and 3B, a voltage spike VSb may be generated by inductance of the parasitic inductor 415b, and a voltage spike VSa may be generated by inductance of the parasitic inductor 415a. The more parasitic inductance $L_{PARASITIC}$, the higher a level of a voltage spike generated.

Techniques for reducing a voltage spike of the switching output node LX include reducing a switching slew rate by which a gate of the n-channel power switch 420 is driven. This may reduce or minimize an instantaneous current $I_{SW}$.

Analysis of a p-channel power switch different from that of FIG. 1 and a switching slew rate of an n-channel power switch of FIG. 1 will now be described.

Figure 4A:
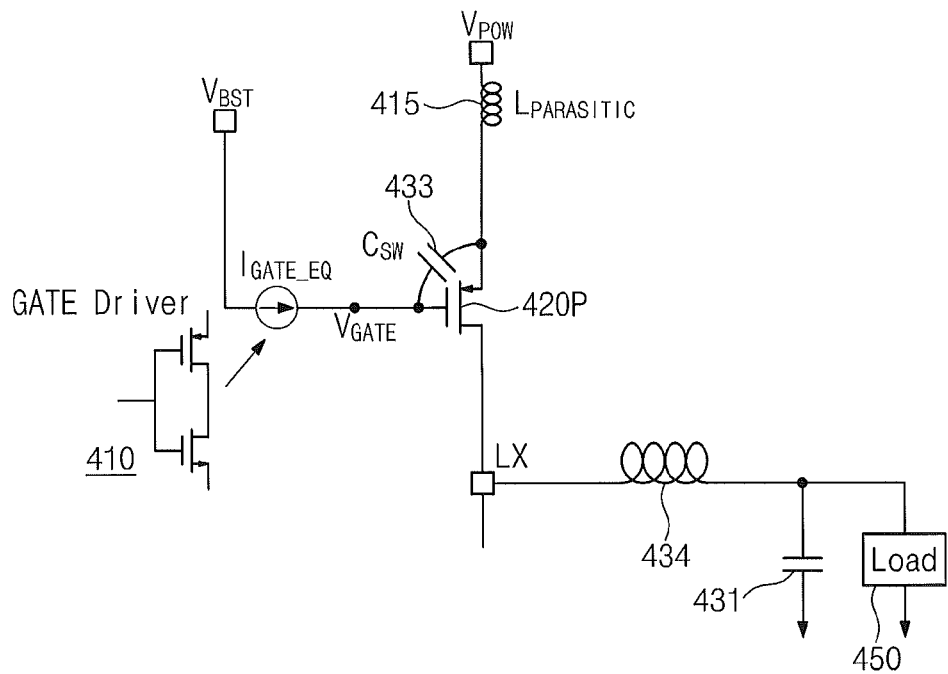
FIGS. 4A and 4B are a schematic diagram and a waveform diagram, respectively, illustrating an equivalent circuit of a gate driver of the converter of FIG. 1 and input/output voltage waveforms thereof.
Figure 4B:
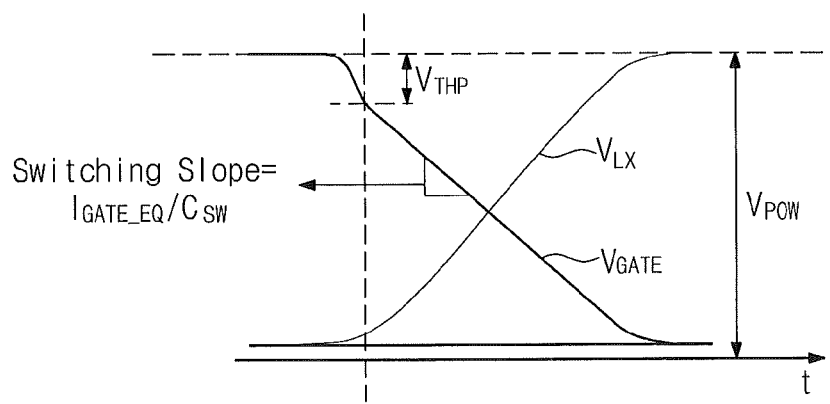
Figure 5:
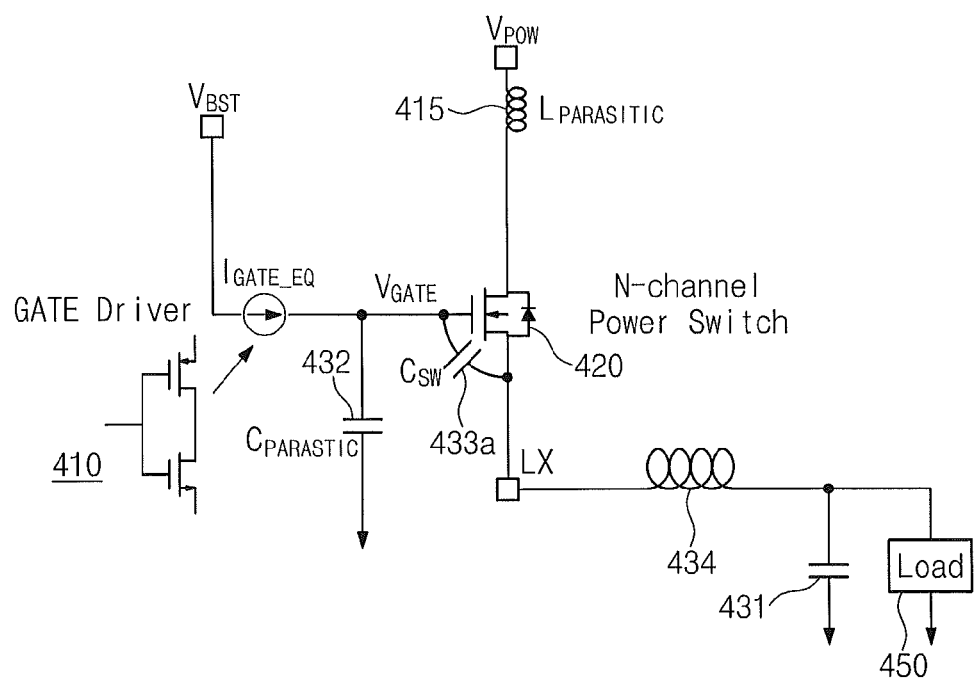
FIG. 5 is a schematic diagram illustrating an equivalent circuit and an n-channel power switch of a gate driver of the converter of FIG. 1.

FIGS. 4A and 4B illustrates an equivalent circuit of a gate driver of a converter circuit of FIG. 1 using a simple p-channel power switch and input/output voltage waveforms, respectively. FIG. 5 is a diagram schematically illustrating an equivalent circuit of a gate driver of a converter circuit of FIG. 1 using an n-channel power switch.

A converter circuit including a conventional and simple high side p-channel power switch 420P will be described with reference to FIG. 4. For a simple and clear description, a gate driver 410 may be modeled as an equivalent current source $I_{GATE\_EQ}$, and a p-channel power switch 420P may be modeled as an equivalent gate-source capacitor $C_{SW}$.

In the event that a power switch is a high side p-channel power switch, referring to a right-side waveform of FIG. 4B, $V_{GATE}$ and $V_{LX}$ may swing between $V_{POW}$ and 0V. In this case, there may be understood that a switching slew rate is simply expressed by $I_{GATE\_EQ}/C_{SW}$. Thus, it is possible to obtain a required slew rate of the p-channel power switch by appropriately adjusting a current driving power of the gate driver.

FIG. 5 illustrates an equivalent circuit of a gate driver 410 and an n-channel power switch 420 of a converter circuit of FIG. 1. Like the circuit of FIG. 4A, the n-channel power switch 420 may be modeled as an equivalent gate-source capacitor $C_{SW}$. An equivalent capacitor 433a may be connected between $V_{GATE}$ and a switching output node LX, and a parasitic capacitor 432 having parasitic capacitance $C_{PARASITIC}$ may be connected between the $V_{GATE}$ and a ground. Also, the gate driver 410 may be modeled as an equivalent current source $I_{GATE\_EQ}$.

An operation of FIG. 5 will be more fully described with reference to FIG. 6, which illustrates input/output voltage waveforms of the circuit of FIG. 5. Unlike a p-channel power switch of FIG. 4A, operations of an n-channel power switch 420 may be divided into three sections according to a bootstrap effect between a switching output node LX and a gate voltage $V_{GATE}$ as illustrated in FIG. 3.

During a first section T1, a voltage $V_{LX}$ of the switching output node LX may be fixed to a real ground, and the gate voltage $V_{GATE}$ increases by charging a gate-source capacitor $C_{SW}$ by an equivalent current source $I_{GATE\_EQ}$. When the gate voltage $V_{GATE}$ rises to a voltage $V_{THN}$, the n-channel power switch 420 turns on.

During a second section T2, as the n-channel power switch 420 is turned on, the voltage $V_{LX}$ may be bootstrapped up to a voltage $V_{POW}$, and the gate voltage $V_{GATE}$ may increase along the same slope as that of the voltage $V_{LX}$.

During a third section T3, the gate voltage $V_{GATE}$ may be charged up to a voltage level of $V_{BST}$ ($V_{DD}$+$V_{LX}$) by the equivalent current source $I_{GATE\_EQ}$.

Slew rates of the first and third sections may be the same as those of a conventional p-channel power switch. However, a fast slew rate of the second section T2 may cause a voltage spike.

Figure 6:
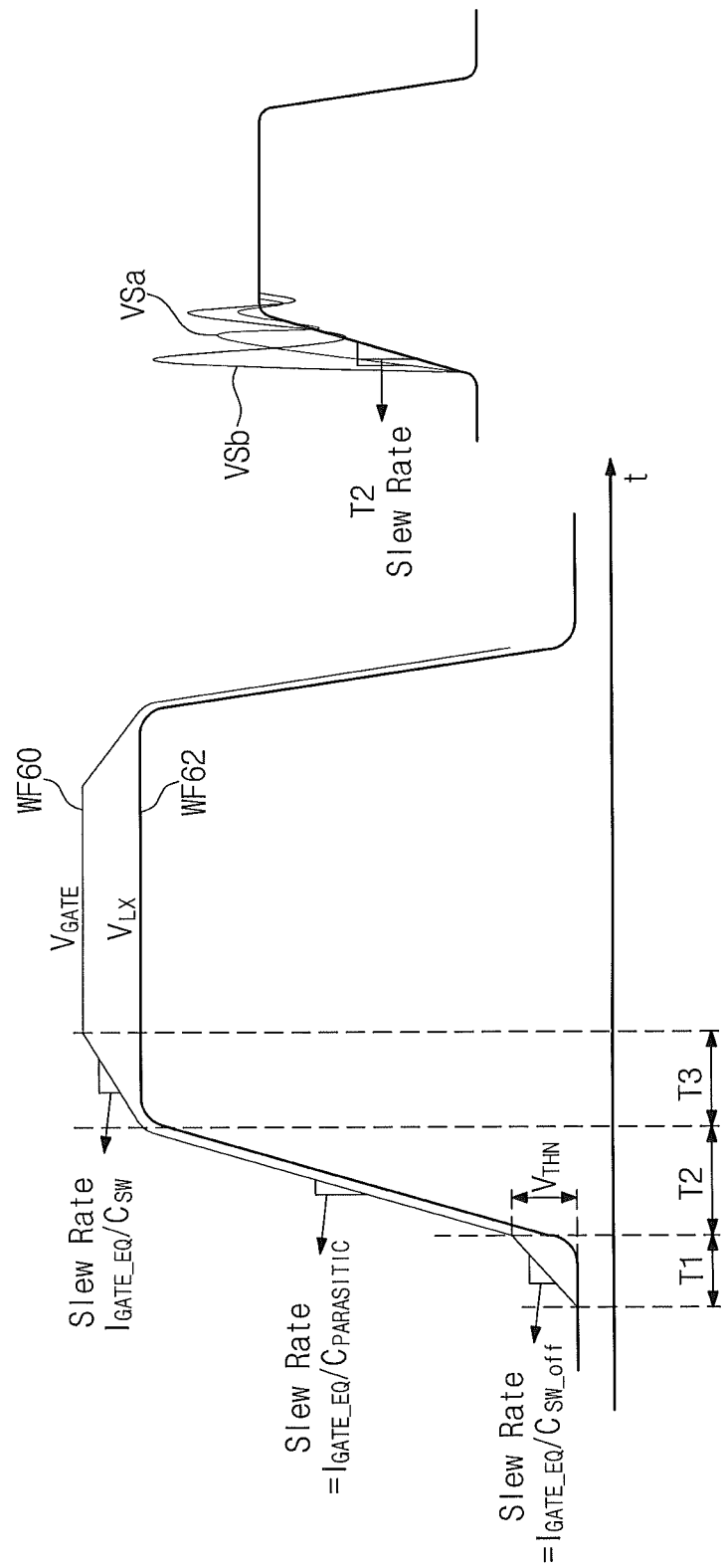
FIG. 6 is a waveform diagram illustrating input/output voltage waveforms of the circuit of FIG. 5.
Figure 7:
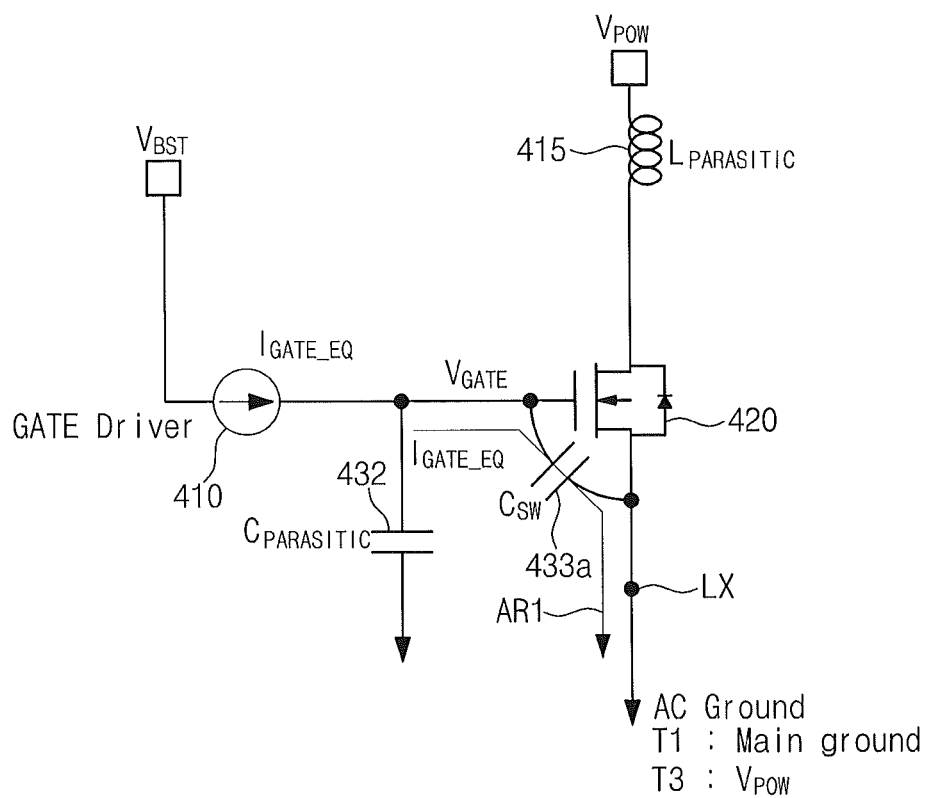
FIG. 7 is a schematic diagram illustrating a simplified equivalent circuit model of the converter circuit of FIG. 1.
Figure 8:
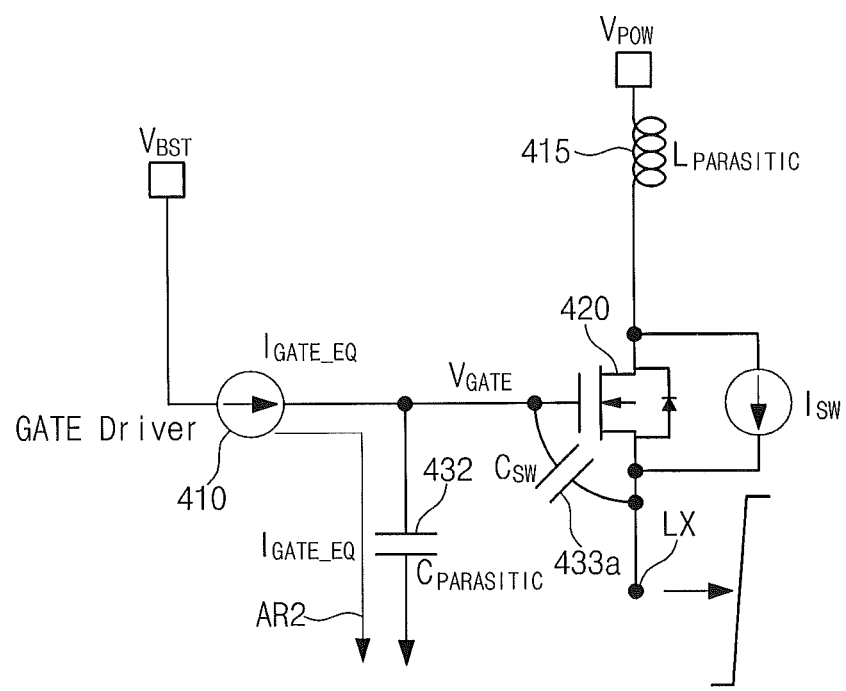
FIG. 8 is a schematic diagram illustrating a simplified equivalent circuit model of the converter circuit of FIG. 1.

Each section may be analyzed with reference to FIGS. 7 and 8. FIG. 7 is a diagram schematically illustrating a simple equivalent circuit model of a converter circuit of FIG. 1 associated with first and third sections of FIG. 6. FIG. 8 is a diagram schematically illustrating a simple equivalent circuit model of a converter circuit of FIG. 1 associated with a second section of FIG. 6.

Referring to FIG. 7, a node LX may be set to an AC ground (e.g., ground in T1 and $V_{POW}$ in T3). Since a value of an equivalent gate-source capacitor CSW is far larger than a value of parasitic capacitance $C_{PARASITIC}$, a switching slew rate may be expressed by $I_{GATE\_EQ}/(C_{SW}+C_{PARASITIC})$ ($=I_{GATE\_EQ}/C_{SW}$). During first and third sections T1 and T4, $I_{GATE\_EQ}$ may flow to the equivalent gate-source capacitor $C_{SW}$ as illustrated by an arrow AR1.

Unlike FIG. 7, in FIG. 8, a second section may be a flying section where a voltage VLX of the switching output node LX is bootstrapped. Thus, impedance seen from a gate voltage $V_{GATE}$ to the equivalent gate-source capacitor $C_{SW}$ may be a high impedance. During the second section T2, since $I_{GATE\_EQ}$ flows to parasitic capacitance $C_{PARASITIC}$, not the equivalent gate-source capacitor $C_{SW}$, the switching slew rate may be $I_{GATE\_EQ}/C_{PARASITIC}$. Thus, a slew rate may be sharply increased.

In summary, a switching slope slew rate may be $I_{GATE\_EQ}/C_{SW}$ in first and third sections T1 and T3 and $I_{GATE\_EQ}/C_{PARASITIC}$ in a second section T2. The high slew rate of the second section T2 may be a main factor in causing a large voltage spike of a node LX.

A conventional technique of lowering a slew rate by reducing $I_{GATE\_EQ}$ shown in FIGS. 7 and 8 may be used to reduce a voltage spike generated at the switching output node LX. However, such a technique may cause power loss. In particular, if $I_{GATE\_EQ}$ is decreased on the basis of a slew rate of the second section T2, switching slopes of the first and third sections T1 and T3 may be also decreased. For this reason, a lot of power loss may be generated.

Also, although $I_{GATE\_EQ}$ is designed according to $C_{PARASITIC}$, to exactly estimate a level of parasitic inductance $L_{PARASITIC}$ may be difficult due to external wire bonding and the like. As a result, if a slew rate becomes slow into the ground due to over-estimation on the parasitic inductance $L_{PARASITIC}$, switch conduction power loss may be generated due to over-estimation. On the other hand, if a slew rate becomes faster than a predetermined level due to under-estimation on the parasitic inductance $L_{PARASITIC}$, it may be difficult to properly limit a voltage spike.

Figure 9:
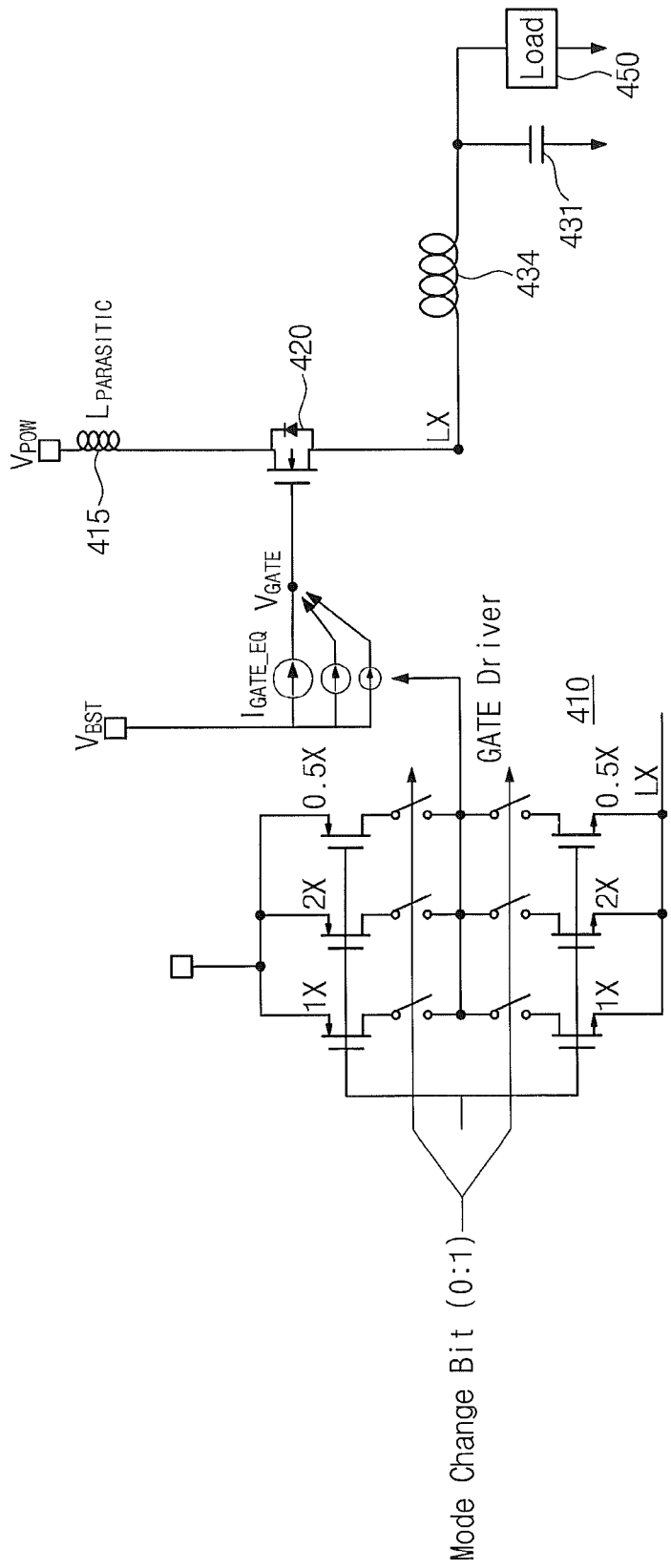
FIG. 9 is a schematic diagram illustrating a converter circuit using a mode changing gate driver.

As illustrated in FIG. 9, a gate driver having a plurality of selection modes may be applied to a converter circuit to better the above-described drawbacks.

FIG. 9 is a diagram schematically illustrating a converter circuit where a gate driver of FIG. 1 is changed with a mode changing gate driver.

Referring to FIG. 9, a gate driver 410 may perform a driving operation according to a plurality of selection modes. A driving capacity of the gate driver 410 may be changed according to a mode change bit. For example, $I_{GATE\_EQ}$ may be changed from 0.5× to 3.5× by changing the mode change bit. A designer may select a value of the mode change bit properly through comparison of a mounting measurement value of a voltage spike.

A technique of selecting a driving capacity of a gate driver of FIG. 9 using a mode change mode may have the following drawbacks.

First, a silicon area may be wasted by unused transistors other than transistors used to make a proper driving value of the gate driver. Second, since a size of the gate driver is changed by a limited step, it is difficult to find an optimum switching slew rate point.

Also, since a technique using FIG. 9 selects a fixed switching slew rate, it is difficult to cover various load current situations and application board environments. For example, in the event that a switching slew rate is set slowly to correspond to a relatively large voltage spike level generated under a heavy load current condition, the voltage spike may be limited within all sections. However, since the slew rate becomes slow into the ground under a light-to-medium load current condition, a lot of power loss may be caused. Thus, power efficiency may be lowered.

As another example, in the event that a voltage spike is limited by properly setting a switching slew rate for a first application, the voltage spike may not be limited properly for another application. Thus, to slow a slew rate more and more for solving of the problem may cause power loss by margin.

Figure 10:
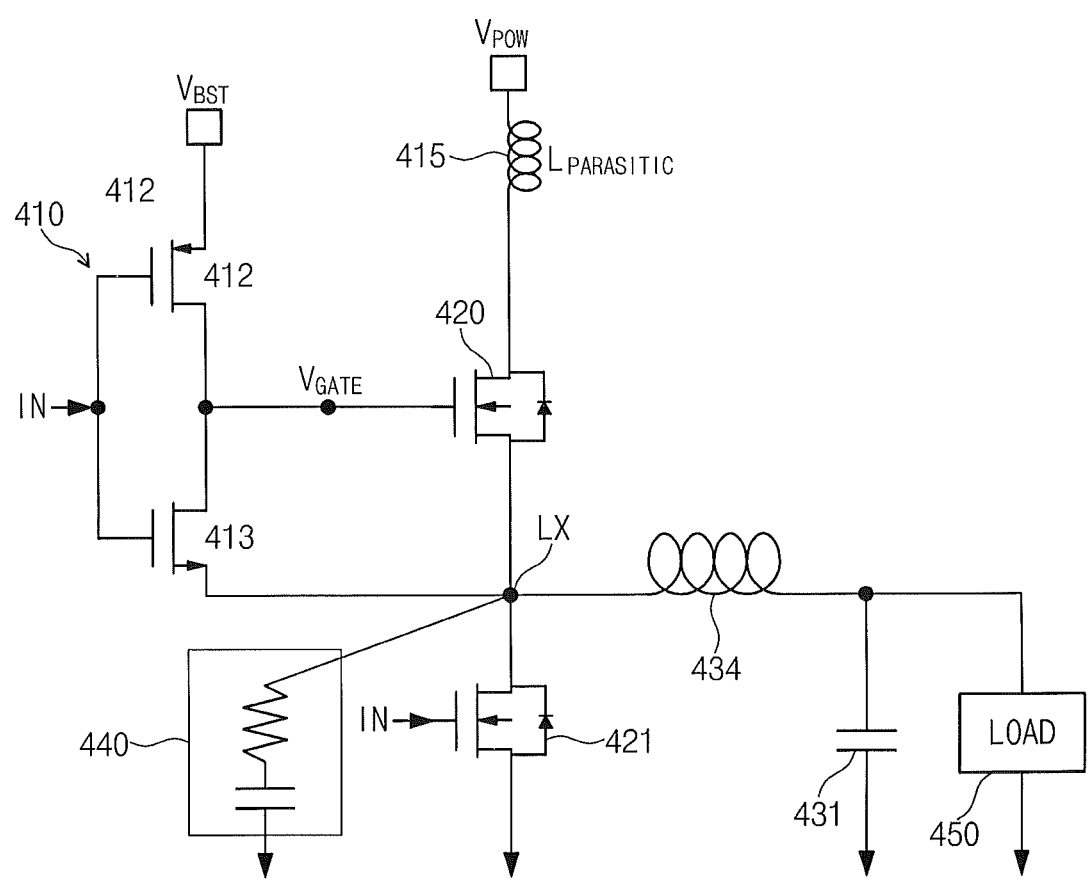
FIG. 10 is a schematic diagram a converter circuit with a snubber circuit.

As illustrated in FIG. 10, a voltage spike may be reduced by applying a snubber circuit within a circuit. FIG. 10 is a diagram illustrating adding a snubber circuit to a converter circuit of FIG. 1. Referring to FIG. 10, a snubber circuit 440 may be installed between a switching output node LX and a ground.

It is possible to effectively damp excessive voltage spikes of the switching output node LX. However, power may be unnecessarily consumed, i.e., power efficiency may be lowered. Also, since external elements are additionally installed, additional cost or area consumption may be generated.

As described above, a conventional method of slowing a switching slew rate of a power switch for limitation of a voltage spike may prevent or reduce problems generated by the voltage spike, for example, an EMI noise, a damage of an internal element, dynamic power loss, and an abnormal operation of a regulator controller due to a noise. However, these techniques may increase switch conduction power loss. Also, it may be difficult control voltage spikes in different applications.

Thus, a device for realizing the same voltage spike suppression performance under all application board situations may be required. An example adaptive power converter capable of adaptively controlling a voltage spike generated at switching according to some embodiments of the inventive subject matter is illustrated in FIG. 11.

Figure 11:
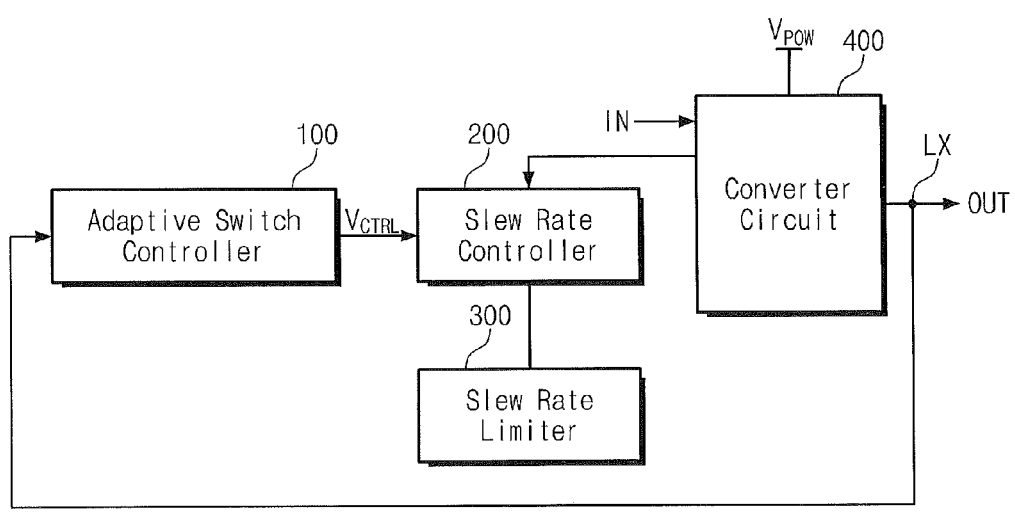
FIG. 11 is a schematic diagram illustrating a power converter according to some embodiments of the inventive subject matter.

Referring to FIG. 11, a power converter may include a converter circuit 400 and a slew limiter 300. The converter circuit 400 may include a power switch 420, which drives a voltage of a driving power node VPOW according to a gate input voltage to apply it to a switching output node LX.

The slew limiter 300 may be connected between a gate of the power switch 420 and a ground. The slew limiter 300 may adjust a slew rate of an output voltage of the switching output node to improve power efficiency and reduce a level of a voltage spike appearing at the output voltage of the switching output node.

Figure 12:
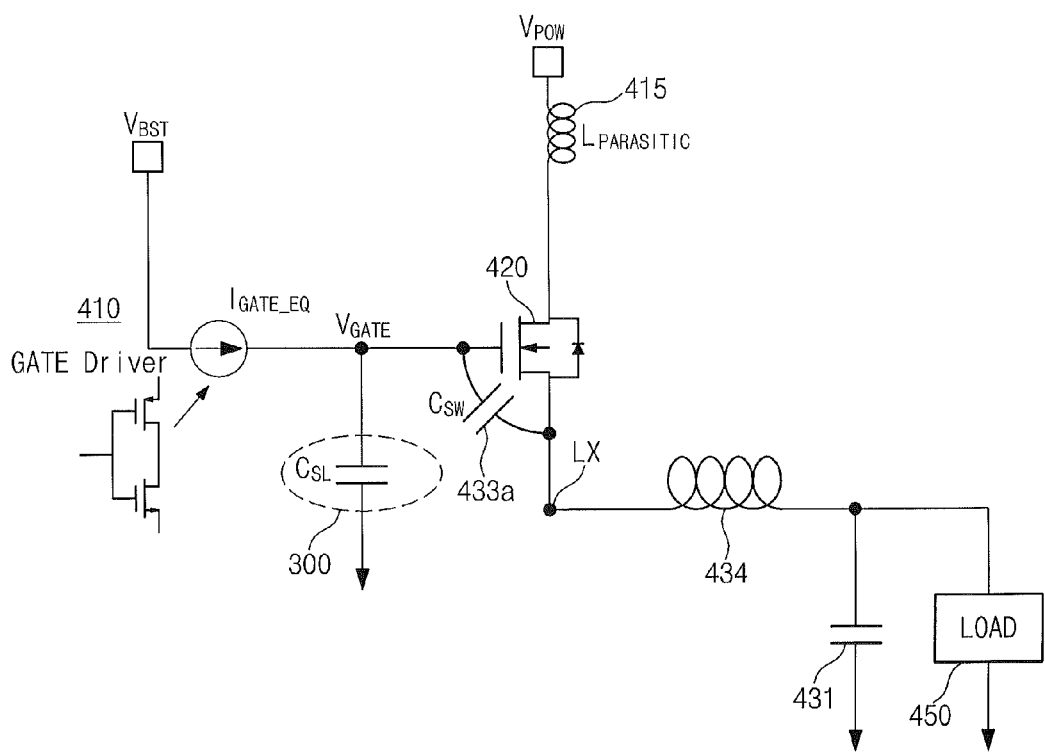
FIG. 12 is a schematic diagram illustrating a converter circuit detailed circuit diagram of a converter circuit to which a slew limiter of FIG. 11 is connected.

As illustrated in FIG. 12, the slew limiter 300 may include a capacitor $C_{SL}$ having a capacitance value smaller than that of gate-source capacitance 433a of the power switch 420.

Referring again to FIG. 11, the power converter may further comprise a slew rate controller 200, which is connected between the gate of the power switch and the slew limiter 300 and adaptively adjusts a current flowing through the slew limiter 300 according a variation in a load.

Figure 14:
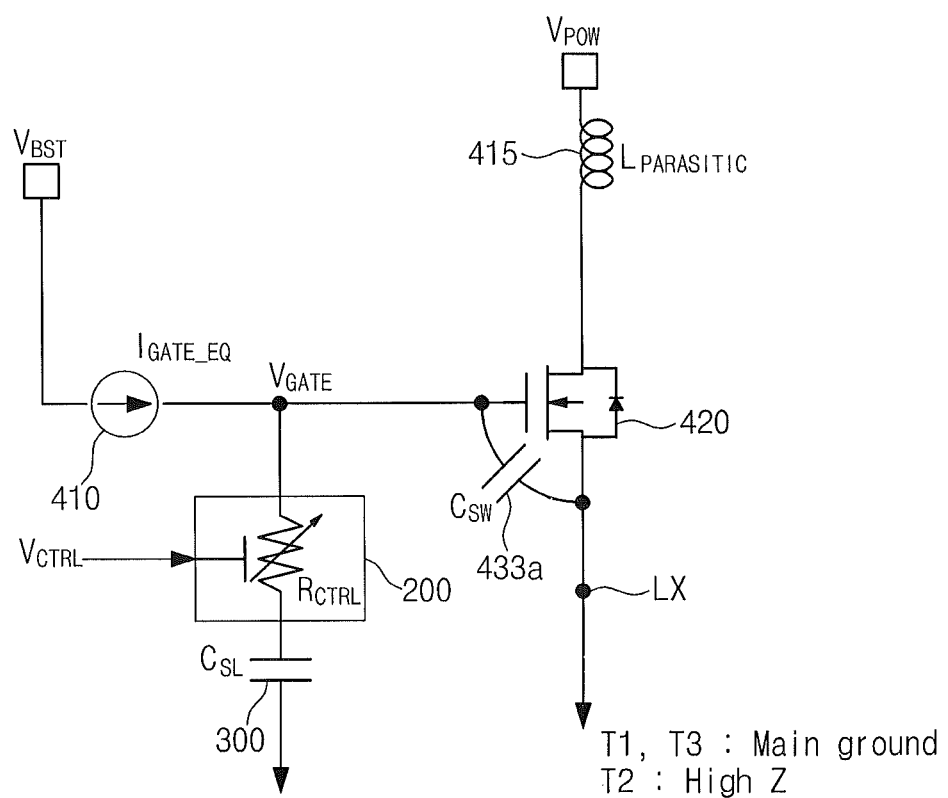
FIG. 14 is a schematic diagram illustrating a converter circuit to which a slew rate controller of FIG. 11 is connected.

As illustrated in FIG. 14, the slew rate controller 200 may include a MOS transistor 200 acting as a variable resistor whose resistance value is varied according to a control voltage signal $V_{CTRL}$.

Referring again to FIG. 11, the power converter may further comprise an adaptive switching controller 100, which monitors an output voltage of the switching output node to generate the control voltage signal $V_{CTRL}$.

Figure 15:
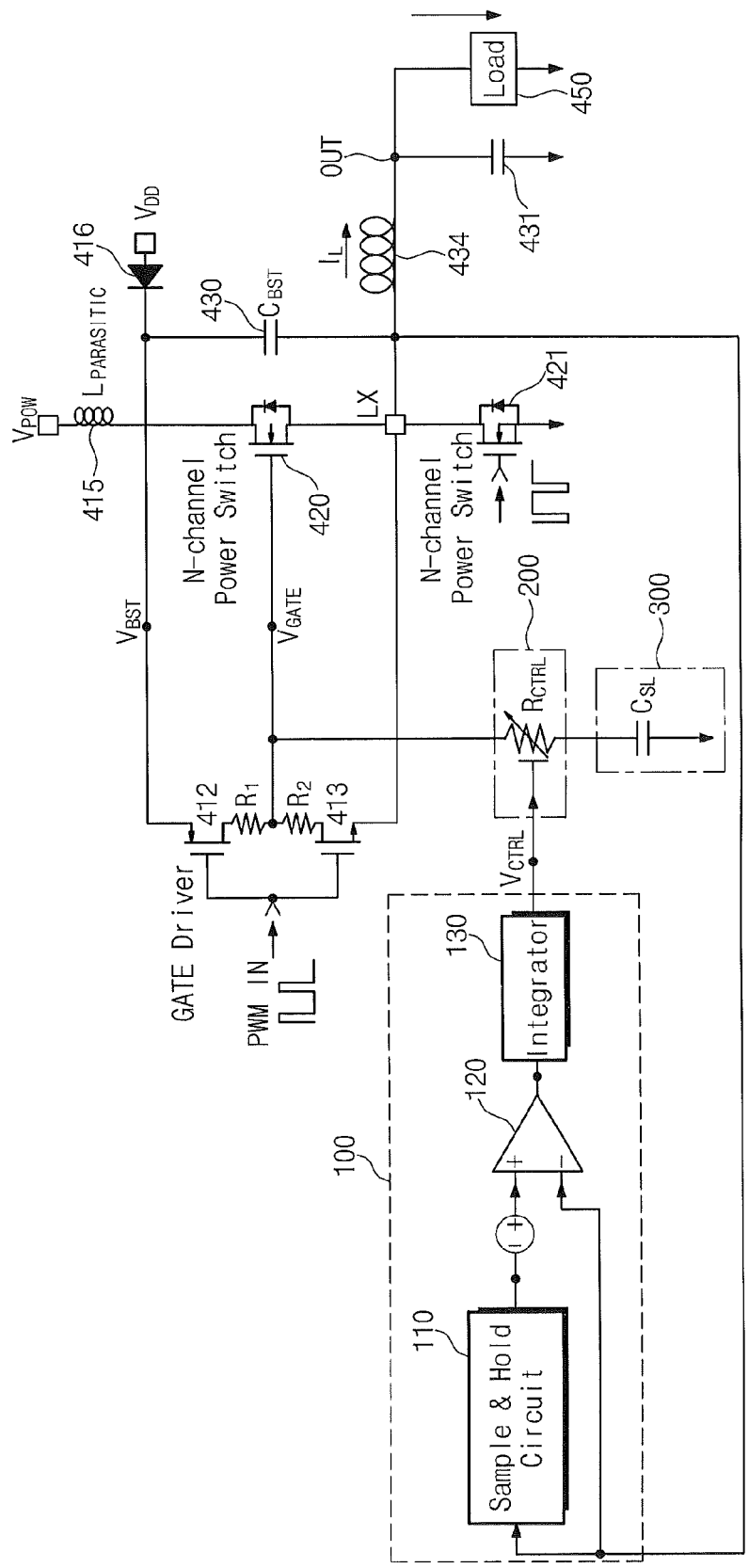
FIG. 15 is a schematic diagram illustrating a power converter according to some embodiments of the inventive subject matter.

As illustrated in FIG. 15, the adaptive switching controller 100 may include a sample and hold circuit 110 configured to sample and hold an output voltage of the switching output node applied during a first operating section, a comparator 120 configured to compared the output voltage of the switching output node with an output of the sample and hold circuit 110 to output a comparison signal indicating whether a voltage spike is detected, and an integrator 130 configured to generate a voltage charged or discharged for a control of a slew rate according to a level of the comparison signal.

Figure 17:
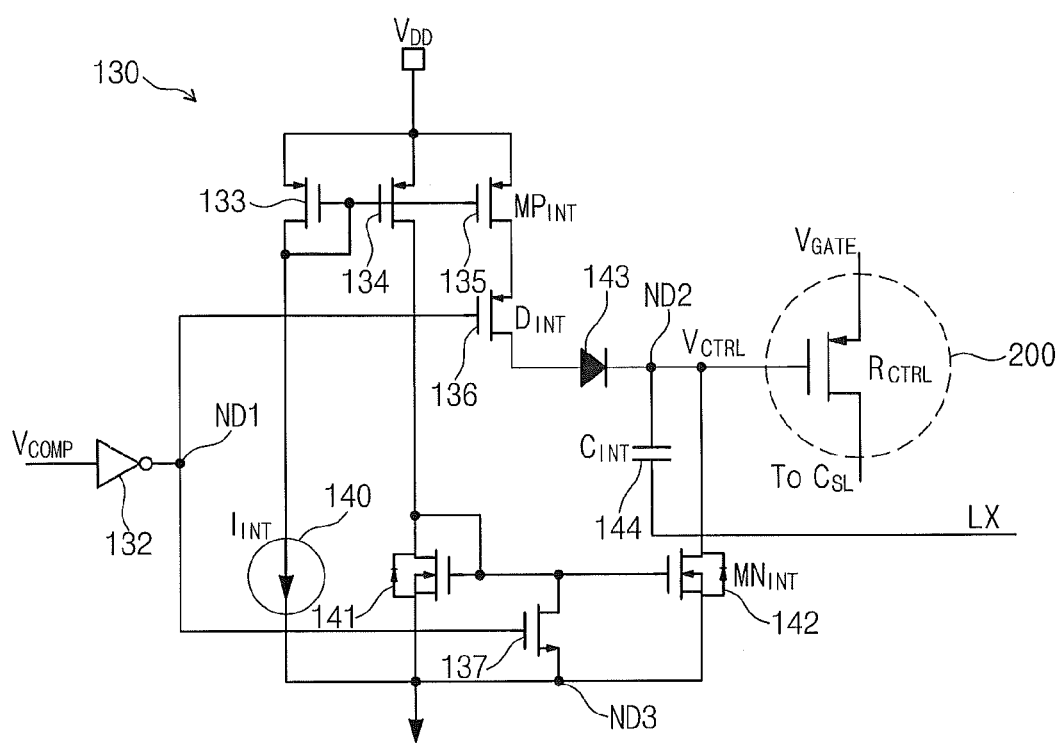
FIG. 17 is a circuit diagram schematically illustrating an integrator of FIG. 15.

Referring to FIG. 17, a diode 143 for preventing a back flow may be additionally installed at a discharging path of the integrator 130.

Figure 16:
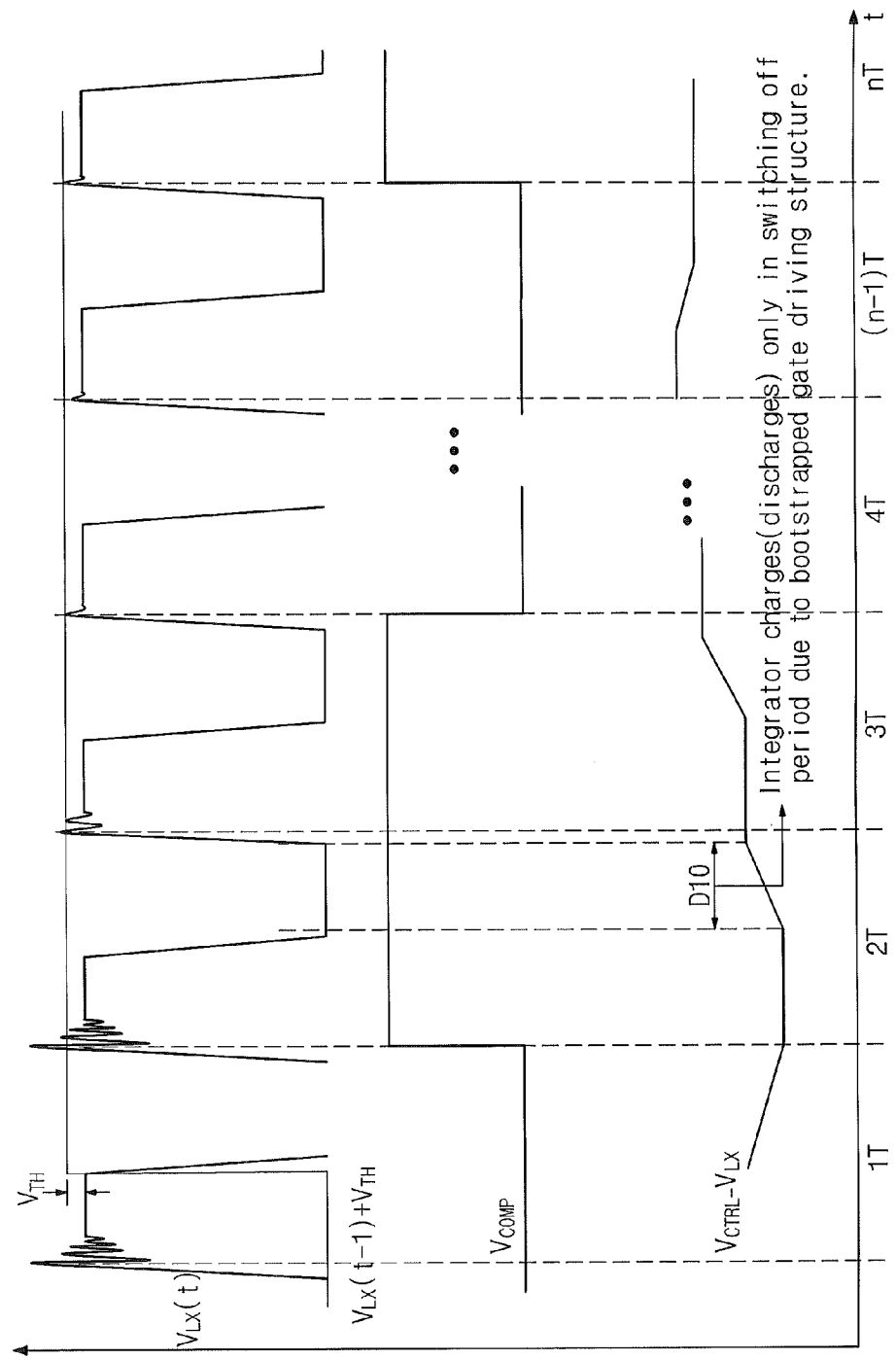
FIG. 16 is waveform diagram illustrating operations of the power converter of FIG. 15.

When an output voltage of the switching output node sampled is held, the sample and hold circuit 110, as illustrated in FIG. 16, may add a threshold voltage VTH being an allowable design value of the voltage spike and the sampled output voltage to hold the added result.

In a converter circuit 400 having the n-channel power switch 420, the slew limiter 300 of FIG. 11 may play a role in solving such a problem that a slew rate sharply rises at a bootstrap section, without a great decrease in power efficiency.

Unlike a control technique of a conventional fixed switching slew rate, the slew rate controller 200 may enable a switching slew rate to be adaptively changed according to an environment or a load variation.

FIG. 12 is a detailed circuit diagram of a converter circuit to which a slew limiter of FIG. 11 is connected. Referring to FIG. 12, a slew limiter 200 may include a slew-limiting capacitor $C_{SL}$ connected between a gate voltage $V_{GATE}$ and a ground. A capacitance of the slew-limiting capacitor $C_{SL}$ may be smaller than that of an equivalent gate-source capacitor $C_{SW}$.

With the slew limiter 200, switching slew rates of first to third sections of FIG. 6 may be controlled such that power efficiency is improved and a voltage spike is reduced. While a voltage spike phenomenon is reduced by decreasing a high slew rate of the second section, power efficiency may be improved at a load current domain, in which power loss is dominant, by increasing slew rates of the first and third sections. This will be more fully described with reference to FIGS. 13A and 13B.

Figure 13A:
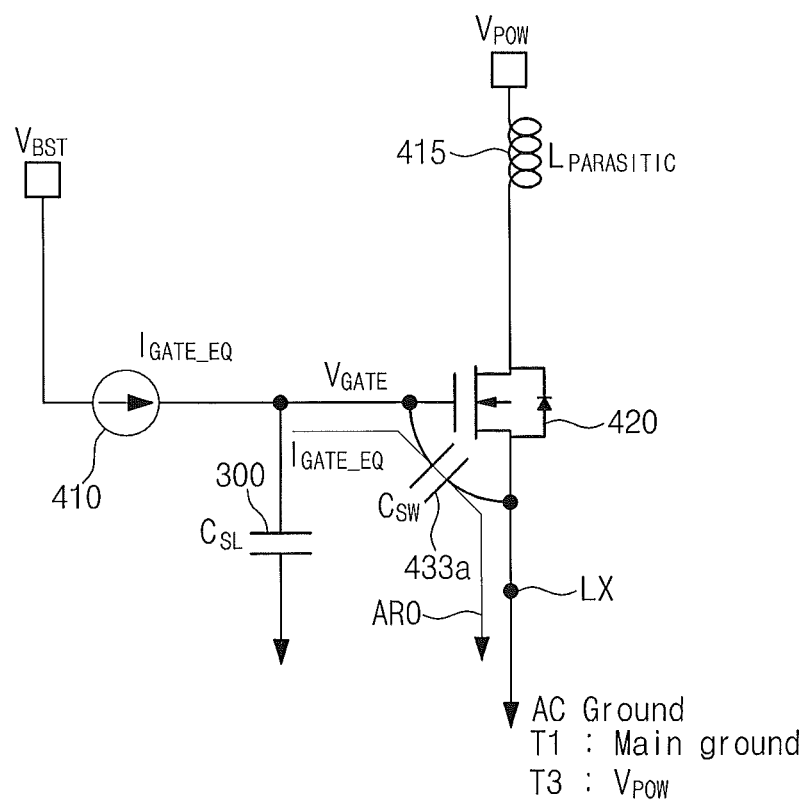
FIG. 13A is a schematic diagram illustrating an equivalent circuit model of a circuit of FIG. 12.
Figure 13B:
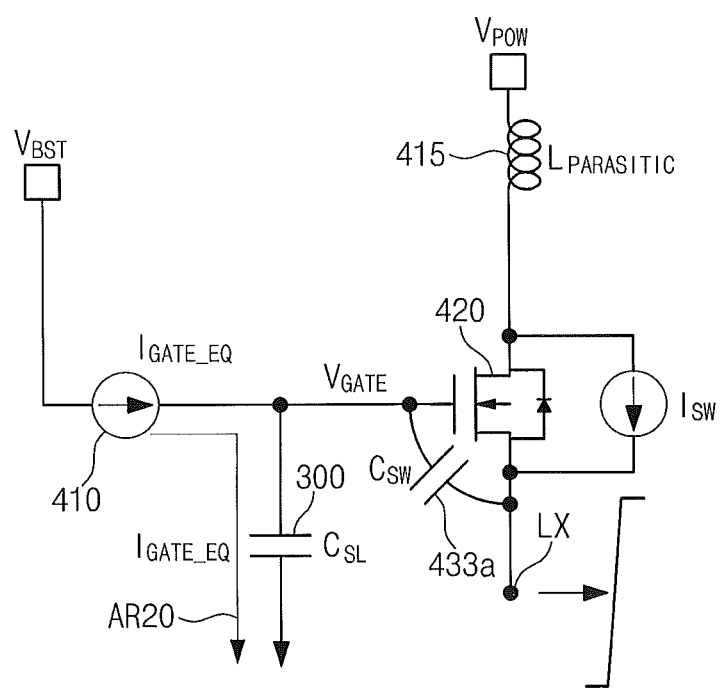
FIG. 13B is a schematic diagram illustrating an equivalent circuit model of a circuit of FIG. 12.

FIG. 13A is a diagram schematically illustrating an equivalent circuit model of a circuit of FIG. 12 similar to that for first and third sections described with reference to of FIG. 6. FIG. 13B is a diagram schematically illustrating an equivalent circuit model of a circuit of FIG. 12 similar that described for a second section described with reference to FIG. 6.

Referring to FIG. 13A, during a second section T2, a switching output node LX being a negative node of an equivalent gate-source capacitor $C_{SW}$ sharply rise through bootstrapping, so that it goes to a high impedance node in terms of an AC characteristic. Therefore, an effective capacitance seen from a gate driver 410 may be a capacitance value of the slew-limiting capacitor $C_{SL}$. A current $I_{GATE\_EQ}$ may flow along an arrow AR2. Thus, at the second section T2, a switching slew rate may be $I_{GATE\_EQ}/C_{SL}$. On the other hand, in the case of FIG. 8, a switching slew rate may be $I_{GATE\_EQ}/C_{PARASITIC}$. In the circuit of FIG. 12, since a capacitance value of the slew-limiting capacitor $C_{SL}$ may be far larger than that of the parasitic capacitor $C_{PARASITIC}$ ($C_{PARASITIC} \ll C_{SL}$), a switching slew rate of the second section T2 may be slower than that described with reference to FIG. 8.

With the above description, a switching slew rate may be controlled to be relatively slower at the second section T2 and to be relatively faster at first and third sections T1 and T3, which have large influence on power efficiency.

Referring to FIG. 13A, during the first and third sections T1 and T3, the switching output node LX being a negative node of an equivalent gate-source capacitor $C_{SW}$ may be set to an AC ground. For example, the switching output node LX may be a real ground voltage in the first section T1 and a voltage of a driving power node VPOW in the third section T3. Therefore, a value of effective capacitance seen from the gate driver 410 may correspond to a sum of capacitance of the equivalent gate-source capacitor $C_{SW}$ and capacitance of the slew-limiting capacitor $C_{SL}$. In this case, a switching slew rate may be $I_{GATE\_EQ}/(C_{SW}+C_{SL})$. Since CSL≪CSW, a switching slew rate of each of the first and third sections T1 and T3 of FIG. 13A may be $I_{GATE\_EQ}/C_{SW}$.

Switching slew rates of first and third sections may be $I_{GATE\_EQ}$ (conventional)/$C_{SW}$, similar to that of FIG. 7. However, since a capacitance value of the slew-limiting capacitor $C_{SL}$ of the second section T2 is larger than parasitic capacitance $C_{PARASITIC}$, $I_{GATE\_EQ}$ of FIG. 13A may be greater than that of FIG. 7. For this reason, switching slew rates of first and third sections may be faster than that of FIG. 7. Since $I_{GATE\_EQ}$ of FIG. 13A ≫ $I_{GATE\_EQ}$ of FIG. 7, overall power efficiency may be improved.

Nevertheless, a circuit in FIG. 12 may have the following structural drawback. In FIG. 12, since the slew-limiting capacitor $C_{SL}$ increases dynamic power loss, it may decrease power efficiency at an extreme light load condition. The dynamic power loss increased may be expressed as follows.

Dynamic power loss $P_{DYNAMIC}$ of a conventional case may be ($C_{SW} \times V_{DD2} \times f_S$). Dynamic power loss $P_{DYNAMIC}$ of FIG. 12 may be ($C_{SW} \times V_{DD2} \times f_S$)+($C_{SL} \times V_{BST2} \times f_S$). Thus, power loss may be additionally generated by ($C_{SL} \times V_{BST2} \times f_S$).

Another drawback may be that it may be difficult to choose an appropriate value for the slew-limiting capacitor $C_{SL}$. If the slew-limiting capacitor $C_{SL}$ is designed to have a large capacitance value, conduction power loss may be generated due to a decrease in a slew rate at each section. If the slew-limiting capacitor is designed to have too a small capacitance value, it may be difficult to properly control a voltage spike. Since a characteristic of a voltage spike is varied according to the amount of load current and a value of parasitic inductance generated at external wire bonding and PCB layout, the desirable value for the slew-limiting capacitor $C_{SL}$ may vary according to each situation.

A circuit of FIG. 12 may solve a voltage spike problem generated at an n-channel power switch by decreasing a slew rate of the second section T2. Simultaneously, the circuit of FIG. 12 may improve power efficiency at a load current domain, in which conduction power loss is dominant, by increasing slew rates of the first and third sections T1 and T3.

However, power efficiency may be lowered by dynamic power loss generated by the slew-limiting capacitor $C_{SL}$ at the extreme light load condition. It is difficult to design a value of the CSL properly according to various situations.

Additional embodiments illustrated in FIG. 14 may address such drawbacks. FIG. 14 is a detailed circuit diagram of a converter circuit to which a slew rate controller of FIG. 11 is connected.

Referring to FIG. 14, a slew rate controller 200 may be connected between a gate of a power switch 420 and a slew limiter 300. A circuit of FIG. 14 may have such a structure that a switching slew rate is adaptively controlled through a variable resistor $R_{CTRL}$. The circuit of FIG. 14 may be implemented by adding the slew rate controller 200 to a circuit of FIG. 12.

In the event that the slew-limiting capacitor $C_{SL}$ and the variable resistor $R_{CTRL}$ are connected in series, a current flowing to the slew-limiting capacitor $C_{SL}$ through the variable resistor $R_{CTRL}$ may be controlled. In FIG. 14, a resistance value of the variable resistor $R_{CTRL}$ may be varied according to a potential level of a control voltage signal $V_{CTRL}$. A variable switching slew rate may be implemented by adjusting a value of $I_{GATE\_EQ}$ for charging the slew-limiting capacitor $C_{SL}$ using the resistance value of the variable resistor $R_{CTRL}$.

A switching slew rate may increase when the resistance value of the variable resistor $R_{CTRL}$ is large and decrease when the resistance value of the variable resistor $R_{CTRL}$ is small. Operations for adjusting the resistance value of the variable resistor $R_{CTRL}$ will be described with reference to FIG. 15.

In FIG. 14, when a load current increases, a high level of voltage spike may be generated. In case of a conventional technique, if a slew rate is fixed low according to a maximum load current situation, a switching slew rate may be reduced into the ground within an intermediate load current range. In this case, power loss may be generated. On the other hand, if a slew rate is set to be high according to a low intermediate load current range, power loss may be reduced. However, a voltage spike may become larger due to an increase in a load current.

According to some embodiments, the control voltage signal $V_{CTRL}$ may be changed such that the resistance value of the variable resistor $R_{CTRL}$ is adjusted. The switching slew rate may be adaptively controlled according to a load current situation and according to a level of the voltage spike differently generated by inductance of an application board. A relatively fast switching slew rate may be set when a load current or inductance in an application board is less. On the other hand, a relatively slow switching slew rate may be set when a load current or inductance in an application board is more. If the slew rate is adaptively controlled according to various variation situations, desirable power efficiency may be achieved.

Below, a technique of adaptively controlling a switching slew rate with a feedback loop structure will be described with reference to FIG. 15. FIG. 15 is a circuit diagram illustrating a power converter of FIG. 11 according to some embodiments of the inventive subject matter. FIG. 16 is an operating waveform diagram for adaptive voltage spike adjustment according to FIG. 15.

Referring to FIG. 15, an adaptive switching controller 100 is configured to control a slew rate controller 200 and monitors an output voltage of a switching output node LX to generate a control voltage signal $V_{CTRL}$. The adaptive switching controller 100 may include a sample and hold circuit 110, a comparator 120, and an integrator 130. The adaptive switching controller 100 may be configured to variably control a switching voltage spike level according to a load current and/or an application.

Below are described operations for detecting a switching voltage spike to generate the control voltage signal $V_{CTRL}$ according to some embodiments.

At a section 1T of FIG. 16, an output voltage $V_{LX}$ of a switching output node LX may be applied to the sample and hold circuit 110. The sample and hold circuit 110 may sample and hold the output voltage $V_{LX}$ of the switching output node LX applied during a first operating section, that is, the section 1T.

As illustrated in FIG. 16, a sampled signal VLX(t−1) may be held at a level of VLX(t−1)+VTH, that is, a final level (after a voltage spike disappears) when VLX goes to a pulse on state plus a threshold voltage VTH being a design margin of the voltage spike.

The comparator 120 may compare the output voltage VLX of the switching output node LX with an output of the sample and hold circuit 110 to output a comparison signal VCOMP indicating whether a voltage spike is detected. When a section 2T of FIG. 16 begins, the comparator 120 may compare the $V_{LX}(t-1)+V_{TH}$ sampled and held and a voltage spike of a current output voltage $V_{LX}(2T)$. That the voltage spike of a current output voltage $V_{LX}(2T)$ exceeds the $V_{LX}(t-1)+V_{TH}$ sampled and held may mean that a voltage spike has been generated. If generation of the voltage spike is detected, the comparator 120 having a function of a latch-type comparator may output a high level of comparison signal $V_{COMP}$ as illustrated in FIG. 16.

A period of each of the first and second operating sections may correspond to a period of an input applied to a gate of a power switch 420.

In example embodiments, an overall voltage spike detecting operation need not be performed within a very short moment when a voltage spike is generated. That is, a voltage spike detecting operation may be very unrestricted in time by comparing a voltage spike of a previous section and a voltage spike of a current section by the operating section unit. That is, since a high-speed circuit for a detecting operation is not required, it is possible to use a circuit with a high level of detection accuracy and high power efficiency.

The integrator 130 may generate a voltage, charged or discharged for adjustment of a slew rate, according to a level of the comparison signal $V_{COMP}$ to output it as the control voltage signal $V_{CTRL}$. The integrator 130 may receive the comparison signal Wow of the comparator 120. The integrator 130 may charge the control voltage signal $V_{CTRL}$ when the comparison signal $V_{COMP}$ has a high level such that impedance of a variable resistor $R_{CTRL}$ is decreased. A switching slew rate of a section following a current section may be lowered. A charging-up operation of the integrator 130 may be performed until a voltage spike does not exceed a required range.

At a section 4T of FIG. 16, since a voltage spike does not exceed a required range, the comparison signal $V_{COMP}$ may transition to a low level like a waveform at the section 4T of FIG. 16. A charging-up operation of the integrator 130 may be ended, and a discharging operation may commence, i.e., the integrator 130 may discharge a voltage of the control voltage signal $V_{CTRL}$. Like a section (n−1)T of FIG. 16, if a slew rate is too slow, a voltage spike lower than $V_{TH}$ may be generated. In this case, the integrator 130 may discharge a voltage of the control voltage signal $V_{CTRL}$ to increase the slew rate. As a result, referring to a section nT of FIG. 16, the slew rate may be regulated such that a voltage spike remains just below $V_{TH}$.

A buck switching converter having a circuit structure of FIG. 15 may control a voltage spike within a $V_{TH}$ level to have a maximum switching slew rate.

Further, a circuit structure of FIG. 15 may compensate for a drawback of additional dynamic power loss due to a slew limiter at a light load condition. Since generation of a voltage spike may be limited at the light load condition, the adaptive switching controller 100 may automatically raise a resistance value of a variable resistor $R_{CTRL}$ up to a very large value. Thus, additional dynamic power loss due to a slew-limiting capacitor $C_{SL}$ may be prevented.

FIG. 17 is a circuit diagram schematically illustrating an integrator of FIG. 15. Referring to FIG. 17, an integrator 130 may include an inverter 132, a diode 143, a current source 140, a capacitor 144, and a plurality of transistors 133, 134, 135, 136, 137, 141, and 142.

The integrator 130 may control a variable resistor $R_{CTRL}$. A resistance value of the variable resistor $R_{CTRL}$ may be varied according to a level of the control voltage signal $V_{CTRL}$. A method of integrating the variable resistor $R_{CTRL}$ cheaply and easily may be to use a CMOS technique. The method of integrating the variable resistor $R_{CTRL}$ using the CMOS technique may experience difficulties at a bootstrap structure. The reason may be that a drain-to-source voltage of the CMOS variable resistor $R_{CTRL}$ is varied from a ground level to a LX level (i.e., a $V_{POW}$ level) every switching on/off section.

Thus, in FIG. 17, a voltage of the control voltage signal $V_{CTRL}$ for controlling the CMOS variable resistor $R_{CTRL}$ may be varied from GND to LX when a drain-to-source voltage of the CMOS variable resistor $R_{CTRL}$ is varied from GND to LX.

A comparison signal $V_{COMP}$ may have a low or high level according to whether a voltage spike is detected. Here, a low level may correspond to a digital signal of "0" and a high level may correspond to a digital signal of "1". The integrator 130 may charge or discharge a capacitor $C_{INT}$ 144 according to a level of the comparison signal $V_{COMP}$. Since the switching output node LX is set to GND at a switching off section, such an operation as a conventional integrator may be performed.

However, at a switching on section, the switching output node LX may be increased up to a driving power node VPOW. The capacitor CINT may automatically bootstrap the control voltage signal $V_{CTRL}$ on the basis of the driving power node VPOW. An actual control voltage signal $V_{CTRL}$ may be ($V_{CTRL}+V_{LX}$), so that a variable resistor $R_{CTRL}$ having a CMOS variable resistor structure may be fixed to the same resistance value as that at a switching off section. A diode $D_{INT}$ 143 may prevent a back flow of the capacitor $C_{INT}$ to a charging path of the integrator 130. Also, in case of the integrator 130 of FIG. 17, a structure of eliminating a cause of a back flow and an NLDMOS mirror for having reliability at a high level of driving power node VPOW may be implemented at a discharging path.

Figure 18:
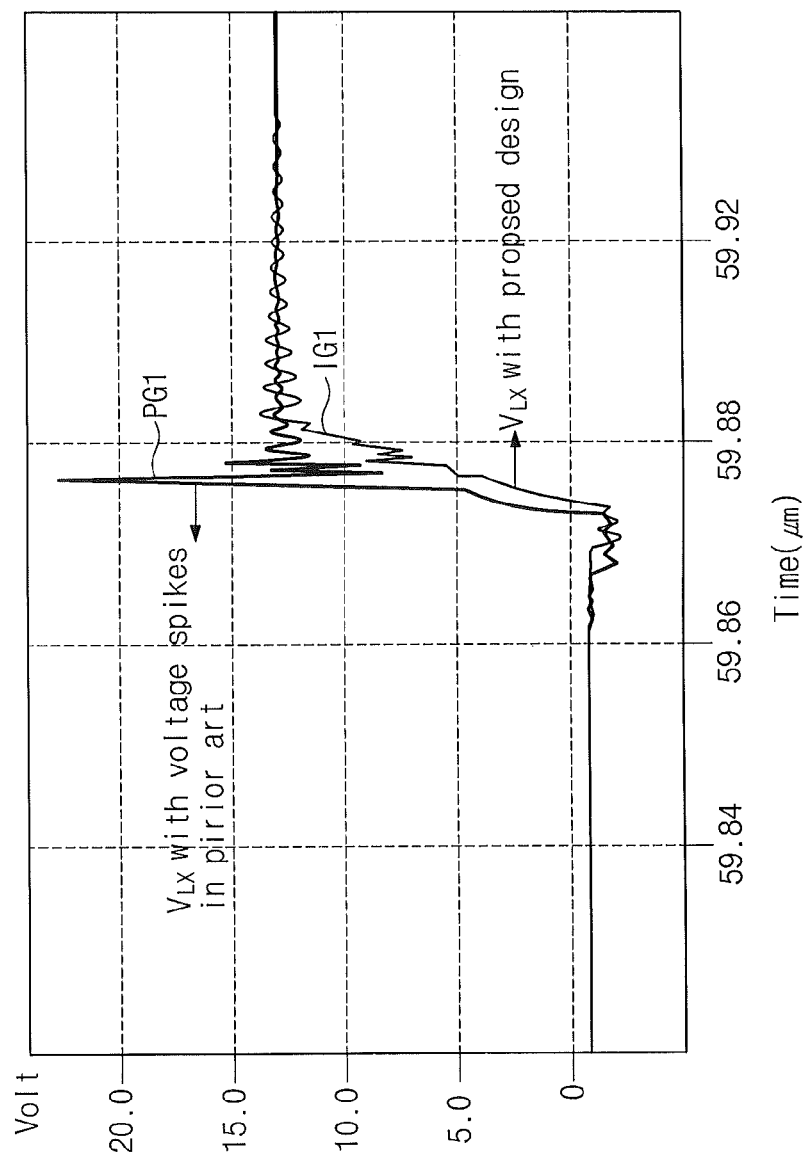
FIG. 18 is a waveform diagram illustrating simulated operations of the power converter of FIG. 15.
Figure 19:
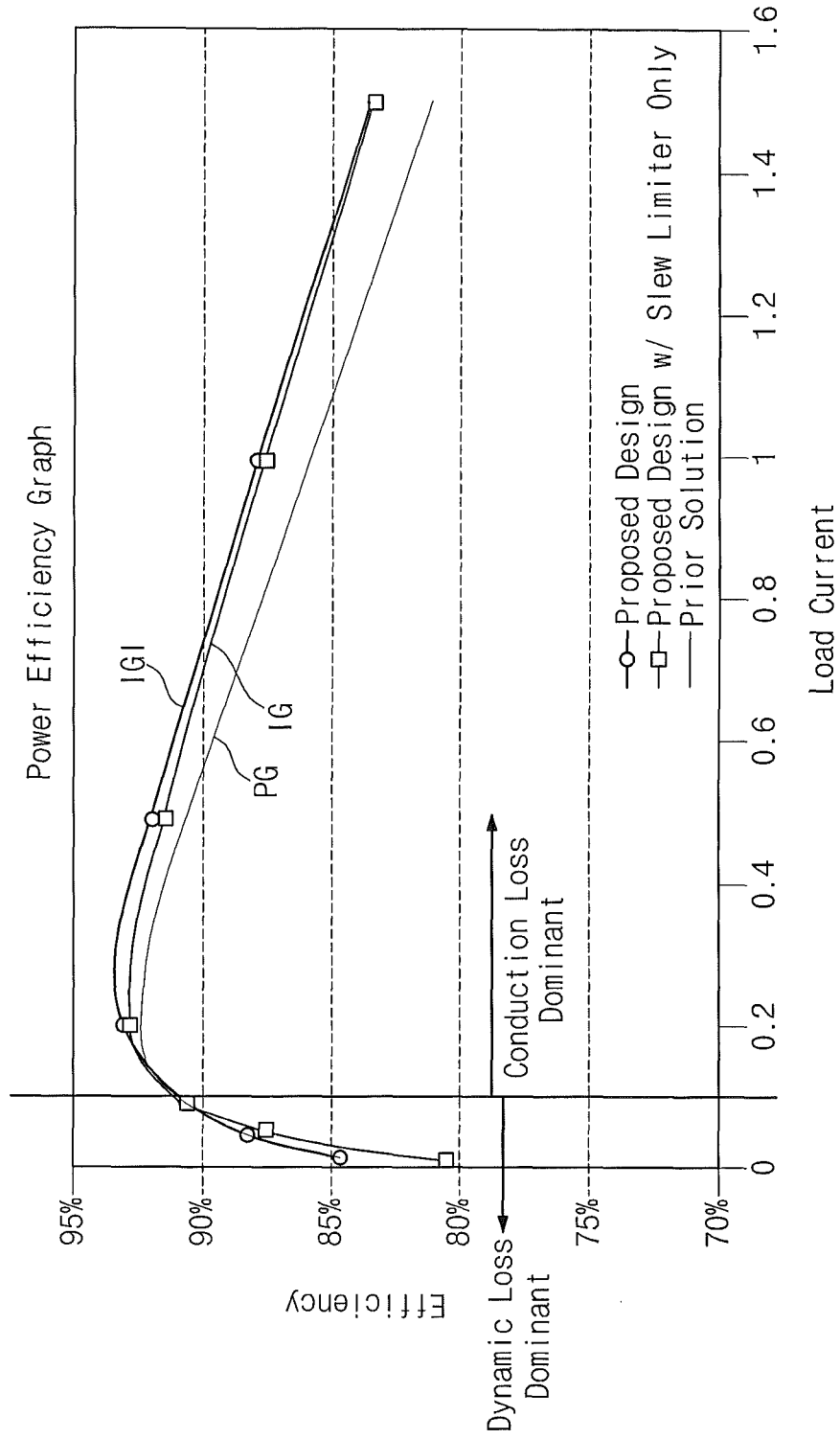
FIG. 19 is a waveform diagram illustrating simulated performance of the power converter of FIG. 15.
Figure 20:
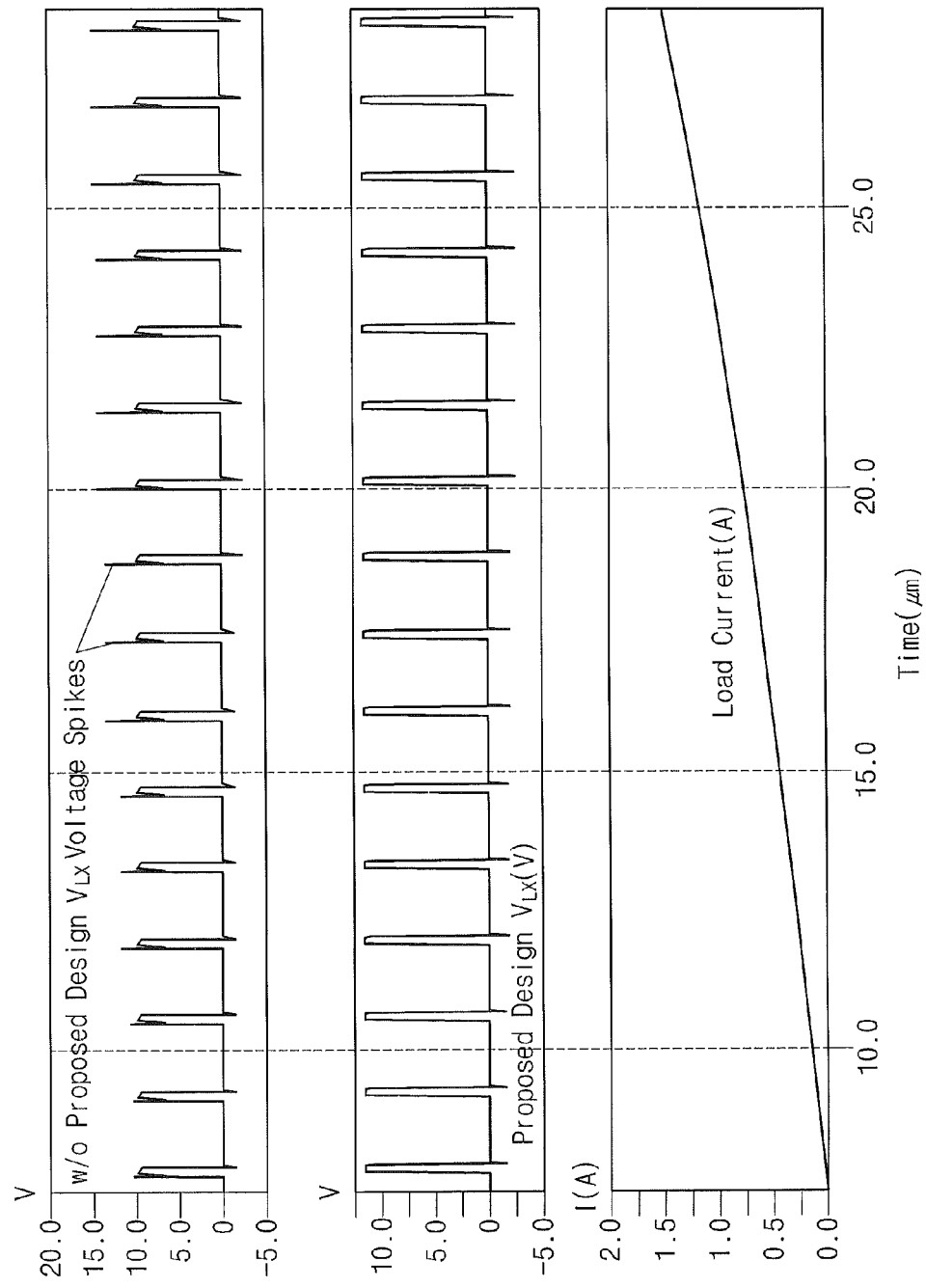
FIG. 20 is a waveform diagram illustrating simulated operations of the power converter of FIG. 15 in response to variation in a load current.

Operating characteristics and benefits according to an embodiment of the inventive subject matter will be described with reference to FIGS. 18 to 20. FIG. 18 is a simulation result waveform diagram illustrating a voltage spike reduced by a power converter of FIG. 15. FIG. 19 is a simulation result waveform diagram illustrating a change of power efficiency by a power converter of FIG. 15. FIG. 20 is a simulation result waveform diagram illustrating improvement of a voltage spike by a power converter of FIG. 15 according to a variation in a load current.

A buck converter of FIG. 15 including a high side n-channel power switch may decrease a switching slew rate of a bootstrap section (corresponding to a section T2 of FIG. 6). Thus, a voltage spike generated at a switching output node may be minimized or reduced over an overall load current range. In addition, the buck converter may increase a switching slew rate of an ON/OFF section of a power switch (e.g., sections T1 and T3 of FIG. 6). Thus, there may be improved power efficiency in modes in which conduction power loss is dominant.

Referring to FIG. 18, a curve IG1 is for a converter that limits voltage spikes using a circuit of FIG. 15 according to some embodiments of the inventive subject matter. A curve PG1 is for a conventional buck converter. In FIG. 18, a horizontal axis indicates a time and a vertical axis indicates a voltage. As understood from simulation result waveforms of FIG. 18, a voltage spike may be effectively reduced by controlling a slew rate at a second section T2.

In FIG. 19, a horizontal axis indicates a load current and a vertical axis indicates power efficiency by %. A curve PG shows power efficiency obtained through a conventional buck converter, and a curve IG shows power efficiency obtained through a circuit of FIG. 12. Also, a curve IG1 shows power efficiency obtained through a circuit of FIG. 14.

Compared with the curve PG corresponding to the case that $I_{GATE\_EQ}$ is considerably decreased, power efficiency corresponding to curves IG and IG1 at 100 mA to 1.5 A domain where conduction power loss is dominant all may be improved. This result may be obtained by controlling a slew rate to become fast at first and third sections T1 and T3.

A slew limiter may minimize or reduce additional dynamic power loss at a light load condition. Since a voltage spike is hardly generated at the light load condition, the feedback architecture of FIG. 15 may enable a value of a variable resistor $R_{CTRL}$ to be increased up to infinity to prevent additional dynamic power loss due to a capacitor $C_{SL}$. Returning to the curve IG of FIG. 19, dynamic power loss may be increased through the use of only a slew limiter compared with the curve PG. That is, referring to the curve IG, power efficiency of a light load current section between 0 and 100 mA may be lowered compared with the curve PG. However, referring to the curve IG1 of FIG. 19, dynamic power efficiency is lowered very little under a light load condition compared with the curve PG.

Since a switching slew rate is adjusted by priority according to a voltage spike level, a voltage spike may be robustly minimized or reduced under various situations of parasitic inductance generated by wire bonding, PCB layout and so on. Since an adaptive slew rate control according to some embodiments may obtain a similar result to that obtained by estimating parasitic inductance accurately, a mode changing gate driver illustrated in FIG. 9 may not be required. Thus, since an unnecessary silicon area required to install such a gate driver is reduced, it is possible to implement a compact circuit and to reduce a cost for implementation.

In some embodiments described with reference to FIG. 16, a slew rate may be adaptively changed to have a maximum value always according to the amount of load current within a range where a voltage spike does not exceed $V_{TH}$. Thus, power loss may be reduced in comparison to conventional techniques. Referring to the curve IG1 of FIG. 19, power efficiency at a maximum current 1.5 A may be equal to that of the curve IG and better than that of the curve PG. As a load current is reduced toward a load current domain lower than the maximum current 1.5 A, power efficiency of the curve IG1 may be gradually better than that of the curve IG. Also, as understood from FIG. 20, a voltage spike may be robustly controlled within $V_{TH}$ over a range of situations. In FIG. 20, a horizontal axis indicates a time and a vertical axis indicates a voltage or a current. In FIG. 20, the uppermost graph may show a switching output voltage waveform associated with a conventional technique, and the lowermost graph may show a load current increased according to a time. In case of the conventional technique, if a load current is increased, a large or small voltage spike may be generated as understood from the uppermost graph. On the other hand, in some embodiments of the inventive subject matter, a voltage spike may be controlled below a threshold voltage VTH over an overall load current domain as understood from a middle graph.

In some embodiments of the inventive subject matter, there is understood from a simulation result that an EMI noise which has become a hot issue at a switching regulator may be relatively reduced.

Figure 21:
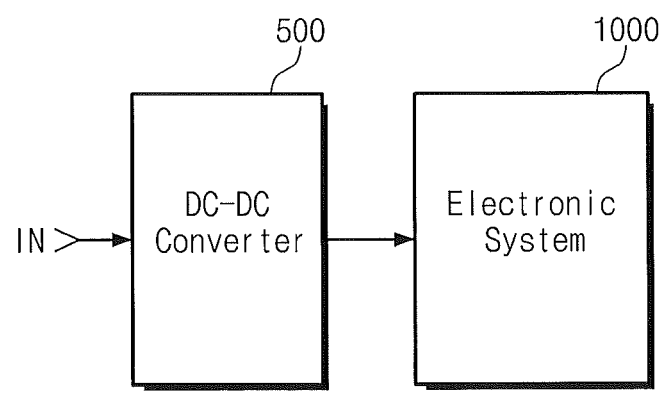
FIG. 21 is a diagram schematically illustrating an application of some embodiments of the inventive subject matter to an electronic system.

FIG. 21 is a diagram schematically illustrating an application where a power converter of FIG. 11 is connected to an electronic system.

Referring to FIG. 21, a DC-DC converter 500 may be implemented by a power converter of FIG. 11 or 15. The DC-DC converter 500 may be connected to an electronic system 1000 to supply a power thereto. The DC-DC converter 500 may control a voltage spike optimally and improve power efficiency relatively, so that the performance of the electronic system 1000 is improved. Also, a power consumption characteristic of the electronic system 1000 may be improved.

The power converter is applicable to a cellular phone, a tablet PC, or a notebook computer to supply a power thereto.

Figure 22:
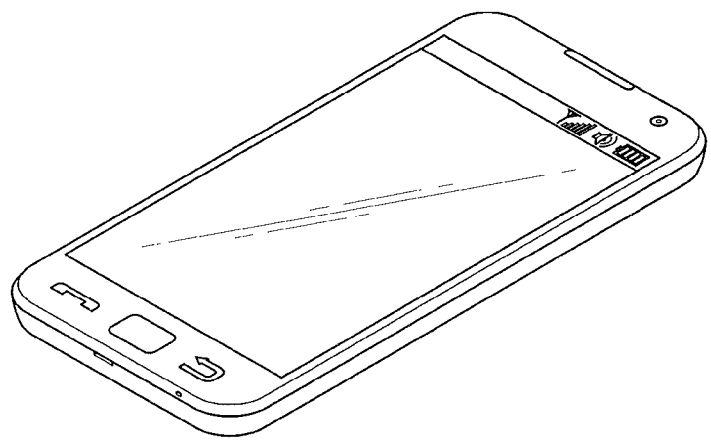
FIG. 22 is a diagram schematically illustrating an application of some embodiments of the inventive subject matter applied to a cellular phone.

FIG. 22 is a diagram schematically illustrating an application of the inventive subject matter applied to a cellular phone.

Referring to FIG. 22, a cellular phone 2000 such as a smart phone produced by various makers may include a power converter having components described with reference to FIG. 11 or 15, so that an operating error of the cellular phone 2000 due to a poor power quality is minimized or prevented. This characteristic may provide high reliability and battery power consumption saving of the cellular phone 2000.

Figure 23:
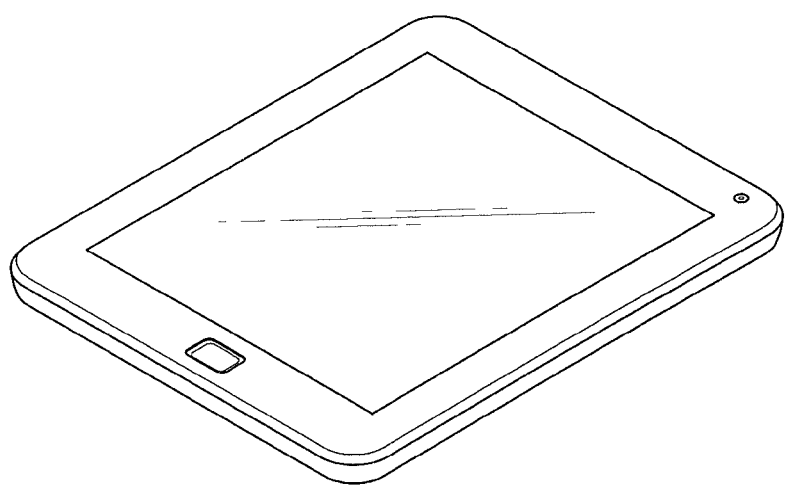
FIG. 23 is a diagram schematically illustrating an application of the inventive subject matter applied to a tablet PC.

FIG. 23 is a diagram schematically illustrating an application of the inventive subject matter applied to a tablet PC.

Referring to FIG. 23, a tablet PC 3000 may include a power converter having components described with reference to FIG. 11 or 15, so that an operating error of the tablet PC 3000 due to a poor power quality is minimized or prevented. This characteristic may provide high reliability and battery power consumption saving of the tablet PC 3000.

Figure 24:
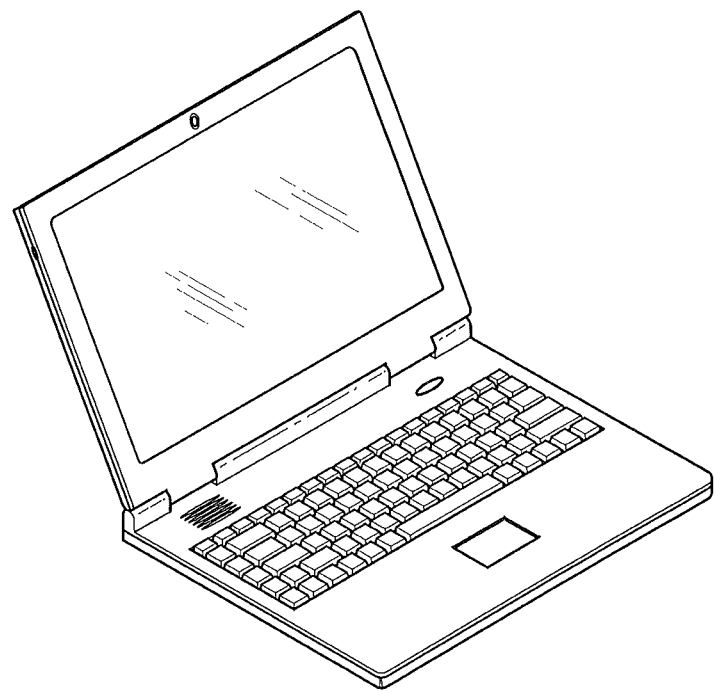
FIG. 24 is a diagram schematically illustrating an application of some embodiments of the inventive subject matter applied to a notebook computer.

FIG. 24 is a diagram schematically illustrating an application of the inventive subject matter applied to a notebook computer.

Referring to FIG. 24, a notebook computer 4000 may include a power converter having components described with reference to FIG. 11 or 15, so that an operating error of the notebook computer 4000 due to a poor power quality is minimized or prevented. This characteristic may provide high reliability and extension of a battery time of the notebook computer 4000.

Figure 25:
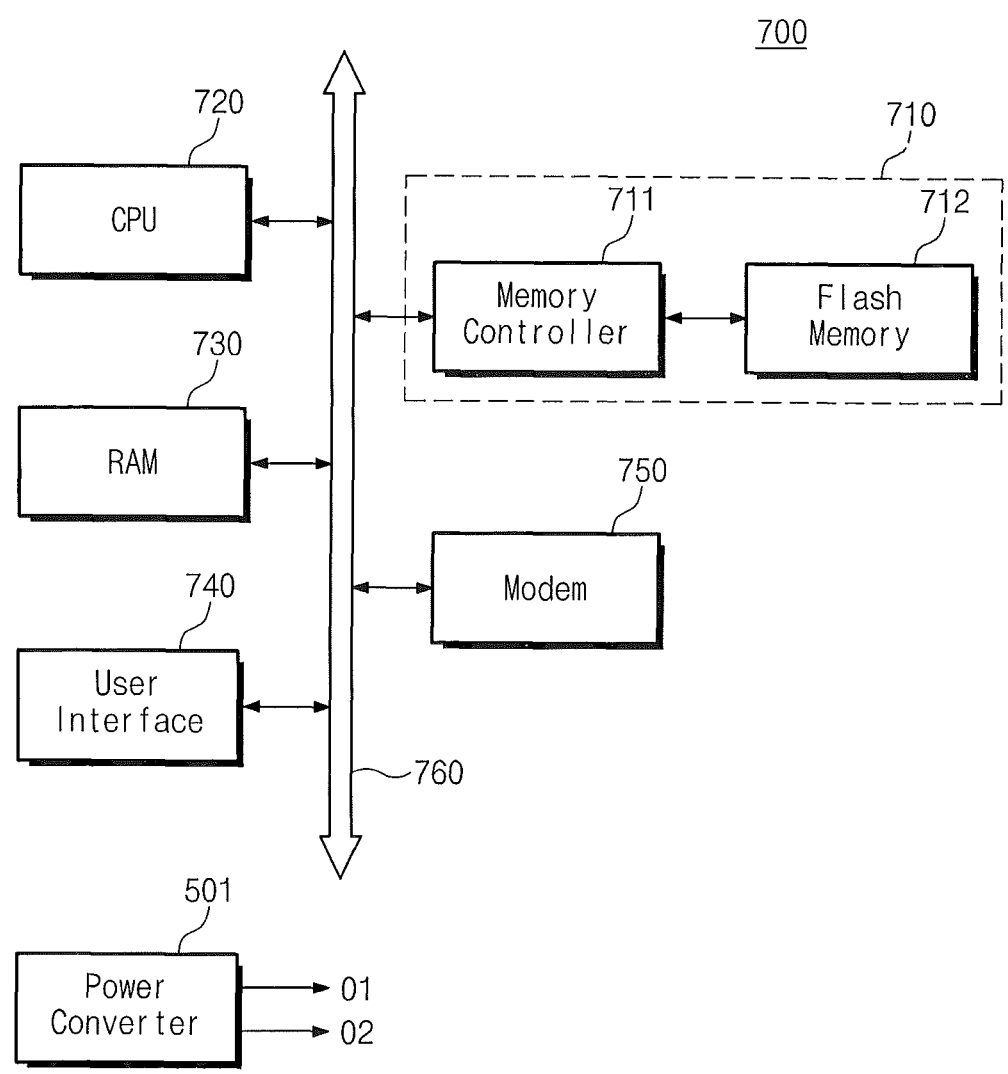
FIG. 25 is a diagram schematically illustrating an application of some embodiments of the inventive subject matter applied to an information processing system.

FIG. 25 is a diagram schematically illustrating an application of the inventive subject matter applied to an information processing system.

Referring to FIG. 25, an information processing system 700 may include a power converter 501 according to the inventive subject matter. The power converter 501 may include a power converter described with reference to FIG. 11 or 15. The power converter 501 may be implemented by a plurality of power converters included in the power converter 501 to output voltages through output terminals O1 and O2.

The information processing system 700 may include a mobile device or a computer. For example, the information processing system 700 may include a memory system and a modem 750, a CPU 720, a RAM 730, and a user interface 740. The components 720 to 750 may be connected to a system bus 760. Data processed by the CPU 720 or input from an external device may be stored at a memory system 710.

The memory system 710 may be provided as a solid state disk, a camera image sensor, and an application chipset. For example, the memory system 710 may include the solid state disk. In the information processing system 700, mass data may be stored at the memory system 810 stably and reliably in virtue of such excellent performance that power efficiency of the power converter 501 is improved and a voltage spike is effectively removed.

In FIG. 25, there is illustrated an example where a memory connected with a memory controller 711 of the memory system 710 is a flash memory. However, the inventive subject matter is not limited thereto. For example, various types of nonvolatile memories can be used. The nonvolatile memory may store various formats of data information such as texts, graphics, software codes, and so on.

The nonvolatile memory may be implemented by EEPROM (Electrically Erasable Programmable Read-Only Memory), CBRAM (Conductive bridging RAM), FeRAM (Ferroelectric RAM), PRAM (Phase change RAM) called OUM (Ovonic Unified Memory), RRAM/ReRAM (Resistive RAM), Nanotube RRAM, PoRAM (Polymer RAM), NFGM (Nano Floating Gate Memory), holographic memory, molecular electronics memory device, or insulator resistance change memory, for example.

While the inventive subject matter has been described with reference to exemplary embodiments, it will be apparent to those skilled in the art that various changes and modifications may be made without departing from the spirit and scope of the inventive subject matter. Therefore, it should be understood that the above embodiments are not limiting, but illustrative. For example, a control method of an adaptive switching controller or internal components thereof may be modified without departing from the spirit and scope of the present invention.

What is claimed is:

1. A power converter, comprising:
   a converter circuit comprising a semiconductor switch configured to couple a power supply node to an output node responsive to an input signal applied to a control terminal thereof; and
   a slew rate limiter circuit comprising a capacitor configured to be coupled to the control terminal of the semiconductor switch and configured to limit a slew rate of an output voltage at the output node; and
   a slew rate controller circuit comprising a variable resistance coupled between the capacitor and the control terminal of the semiconductor switch, the variable resistance configured to vary responsive to a slew rate control signal, and an adaptive switch controller circuit configured to monitor the output voltage and to generate the slew rate control signal responsive to the monitored output voltage.

2. The power converter of claim 1, wherein the semiconductor switch comprises a field-effect transistor (FET), wherein the control terminal comprises a gate terminal of the FET, and wherein the capacitor has a capacitance less than a gate-source capacitance of the FET.

3. The power converter of claim 2, wherein the slew rate controller circuit is configured to adaptively control a current flowing through the slew rate limiter circuit responsive to a load variation at the output node.

4. The power converter of claim 1, wherein the adaptive switch controller circuit comprises:
   a sample and hold circuit configured to sample the output voltage;

a comparator circuit configured to compare a voltage sample produced by the sample and hold circuit to the output voltage and to generate a comparison signal responsive to the comparison; and an integrator circuit configured to integrate the comparison signal to generate the slew rate control signal.

5. The power converter of claim 4, further comprising a diode in a discharge path of the integrator.

6. The power converter of claim 4, wherein the sample and hold circuit is configured to generate a value corresponding to a sum of the sampled output voltage of the switching output node and a threshold voltage representing an allowable voltage spike.

7. The power converter of claim 4, wherein the sample and hold circuit samples using a sampling period corresponding to a period of the input signal.

8. The power converter of claim 7, wherein the input signal comprises a pulse width modulation signal.

9. The power converter of claim 1, wherein the converter circuit comprises a DC-DC buck converter circuit.

10. A method of operating a power converter comprising a semiconductor switch configured to couple a power supply node to an output node responsive to an input signal applied to a control terminal thereof, the method comprising:
monitoring an output voltage of the output node;
generating a slew rate control signal responsive to the monitored output voltage; and
varying an impedance at the control terminal by varying a resistance coupling a capacitor to the control terminal responsive to the slew rate control signal to vary a slew rate of the output voltage.

11. The method of claim 10, wherein varying an impedance at the control terminal by varying a resistance coupling a capacitor to the control terminal responsive to the monitored output voltage comprises increasing a voltage at the control terminal to reduce the slew rate of the output voltage and decreasing the voltage at the control terminal to increase the slew rate of the output voltage.

12. The method of claim 10, wherein varying an impedance at the control terminal by varying a resistance coupling a capacitor to the control terminal responsive to the monitored output voltage comprises adjusting the impedance each period of an input signal applied to the control terminal.

13. A power converter, comprising:
a semiconductor switch configured to couple a power supply node to an output node responsive to an input signal applied to a control terminal thereof;
a capacitor;
a variable resistor coupling the capacitor to the control terminal of the semiconductor switch; and
a slew rate control circuit configured to control the variable resistor responsive to an output voltage at the output node, wherein the slew rate control circuit comprises:
a sampling circuit configured to generate samples of the output voltage; and
a control signal generation circuit configured to apply a control signal to the variable resistor responsive to the samples.

14. The power converter of claim 13, wherein the semiconductor switch comprises an FET and wherein the control terminal comprises a gate terminal of the FET.

15. The power converter of claim 13:
wherein the sampling circuit comprises a sample and hold circuit; and
wherein the control signal generation circuit comprises:
a comparator circuit configured to compare and output of the sample and hold circuit to the output voltage to generate a comparison signal; and
an integrator configured to integrate the comparison signal to generate the control signal.

16. The power converter of claim 15, wherein the sample and hold circuit is configured to sample the output voltage at a frequency of the input signal.

* * * * *